US012690500B2

(12) United States Patent
Su

(10) Patent No.: US 12,690,500 B2
(45) Date of Patent: Jul. 21, 2026

(54) SEMICONDUCTOR DEVICE WITH SPACER AND METHOD FOR FABRICATING THE SAME

(71) Applicant: NANYA TECHNOLOGY CORPORATION, New Taipei City (TW)

(72) Inventor: Kuo-Hui Su, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 364 days.

(21) Appl. No.: 18/599,258

(22) Filed: Mar. 8, 2024

(65) Prior Publication Data

US 2025/0286024 A1     Sep. 11, 2025

(51) Int. Cl.
| | |
|---|---|
| *H01L 25/10* | (2006.01) |
| *H01L 23/00* | (2006.01) |
| *H01L 23/31* | (2006.01) |
| *H01L 23/498* | (2006.01) |
| *H01L 23/528* | (2006.01) |
| *H10W 70/60* | (2026.01) |

(Continued)

(52) U.S. Cl.
CPC .......... *H10W 90/00* (2026.01); *H10W 70/611* (2026.01); *H10W 70/635* (2026.01); *H10W 74/111* (2026.01); *H10W 90/701* (2026.01); *H10W 90/754* (2026.01); *H10W 90/792* (2026.01)

(58) Field of Classification Search
CPC ............. H10W 70/618; H10W 70/611; H10W 70/685
See application file for complete search history.

(56) References Cited

U.S. PATENT DOCUMENTS

| | | | |
|---|---|---|---|
| 2012/0153498 A1* | 6/2012 | Kang ................... | H10W 70/045 257/774 |
| 2022/0139839 A1* | 5/2022 | Yu ........................... | H10P 72/74 257/668 |
| 2022/0293483 A1 | 9/2022 | Tsai et al. | |

FOREIGN PATENT DOCUMENTS

| | | |
|---|---|---|
| TW | 201826474 A | 7/2018 |
| TW | 202201568 A | 1/2022 |

OTHER PUBLICATIONS

Office Action and and the search report mailed on Jul. 15, 2025 related to Taiwanese Application No. 114100939.

(Continued)

*Primary Examiner* — John A Bodnar
(74) *Attorney, Agent, or Firm* — Xuan Zhang

(57) ABSTRACT

The present application discloses a semiconductor device and a method for fabricating the semiconductor device. The semiconductor device includes an interposer having a first surface and a second surface parallel to the first surface; a conductive via extending between the first surface and the second surface of the interposer; an insulation layer separating the conductive via from the interposer; a first electronic component positioned on the second surface and electrically connected to the conductive via; a first conductive element positioned on the first surface of the interposer and electrically connected to the conductive via; a spacer conformally positioned on the first surface of the interposer and on sidewalls of the first conductive element; and a passivation layer positioned on the spacer. The passivation layer has a first dielectric constant, and the spacer has a second dielectric constant less than the first dielectric constant.

12 Claims, 33 Drawing Sheets

(51) Int. Cl.
  *H10W 70/63*         (2026.01)
  *H10W 74/10*         (2026.01)
  *H10W 90/00*         (2026.01)

(56)                    References Cited

OTHER PUBLICATIONS

Summary translation of Office Action and English Abstracts of foreign patent documents related to Taiwanese Application No. 114100939.
Office Action with the search report mailed on Oct. 25, 2024 related to Taiwanese Application No. 113114242.

* cited by examiner

SEMICONDUCTOR DEVICE WITH SPACER AND METHOD FOR FABRICATING THE SAME

TECHNICAL FIELD

The present disclosure relates to a semiconductor device and a method for fabricating the semiconductor device, and more particularly, to a semiconductor device with a spacer and the method for fabricating the semiconductor device with the spacer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including an interposer having a first surface and a second surface parallel to the first surface; a conductive via extending between the first surface and the second surface of the interposer; an insulation layer separating the conductive via from the interposer; a first electronic component positioned on the second surface and electrically connected to the conductive via; a first conductive element positioned on the first surface of the interposer and electrically connected to the conductive via; a spacer conformally positioned on the first surface of the interposer and on sidewalls of the first conductive element; and a passivation layer positioned on the spacer. The passivation layer has a first dielectric constant, and the spacer has a second dielectric constant less than the first dielectric constant.

Another aspect of the present disclosure provides a semiconductor device including an interposer having a first surface and a second surface parallel to the first surface, wherein the interposer defines a first cavity and a second cavity extending between the first surface and the second surface; a through-insulation via positioned within the first cavity; a first electronic component positioned on the second surface of the interposer and electrically connected to the through-insulation via; a second electronic component positioned within the second cavity; a first conductive element positioned on the first surface of the interposer and electrically connected to the through-insulation via; a spacer conformally positioned on the first surface of the interposer and on sidewalls of the first conductive element; and a passivation layer positioned on the spacer. The passivation layer has a first dielectric constant, and the spacer has a second dielectric constant less than the first dielectric constant.

Another aspect of the present disclosure provides a method for fabricating a semiconductor device including providing an interposer including a first surface and a second surface parallel to the first surface; recessing a first cavity from the second surface; forming an insulation layer filling the first cavity; forming a conductive via penetrating the insulation layer; thinning the interposer from the first surface to expose the conductive via; forming a first conductive element on the first surface of the interposer and electrically connected to the conductive via; conformally forming a spacer on the first surface of the interposer and sidewalls of the first conductive element; forming a passivation layer on the spacer; and performing a hybrid bonding technique to bond a first electronic component on the second surface of the interposer and electrically connected to the conductive via. The passivation layer has a first dielectric constant, and the spacer has a second dielectric constant less than the first dielectric constant.

Due to the design of the semiconductor device of the present disclosure, the through-insulation via (e.g., the conductive via) has a relatively small parasitic capacitance in comparison with a through-substrate via. Further the depth of the through-insulation via may be controlled by determining the depth of a cavity of the interposer, and the protection layer may prevent the interposer from being over polished. As a result, the depth of the through-insulation via may be relatively well controlled in comparison with the through-substrate via. In addition, the RC delay may be reduced by employing the passivation layer and spacers having different dielectric constants. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
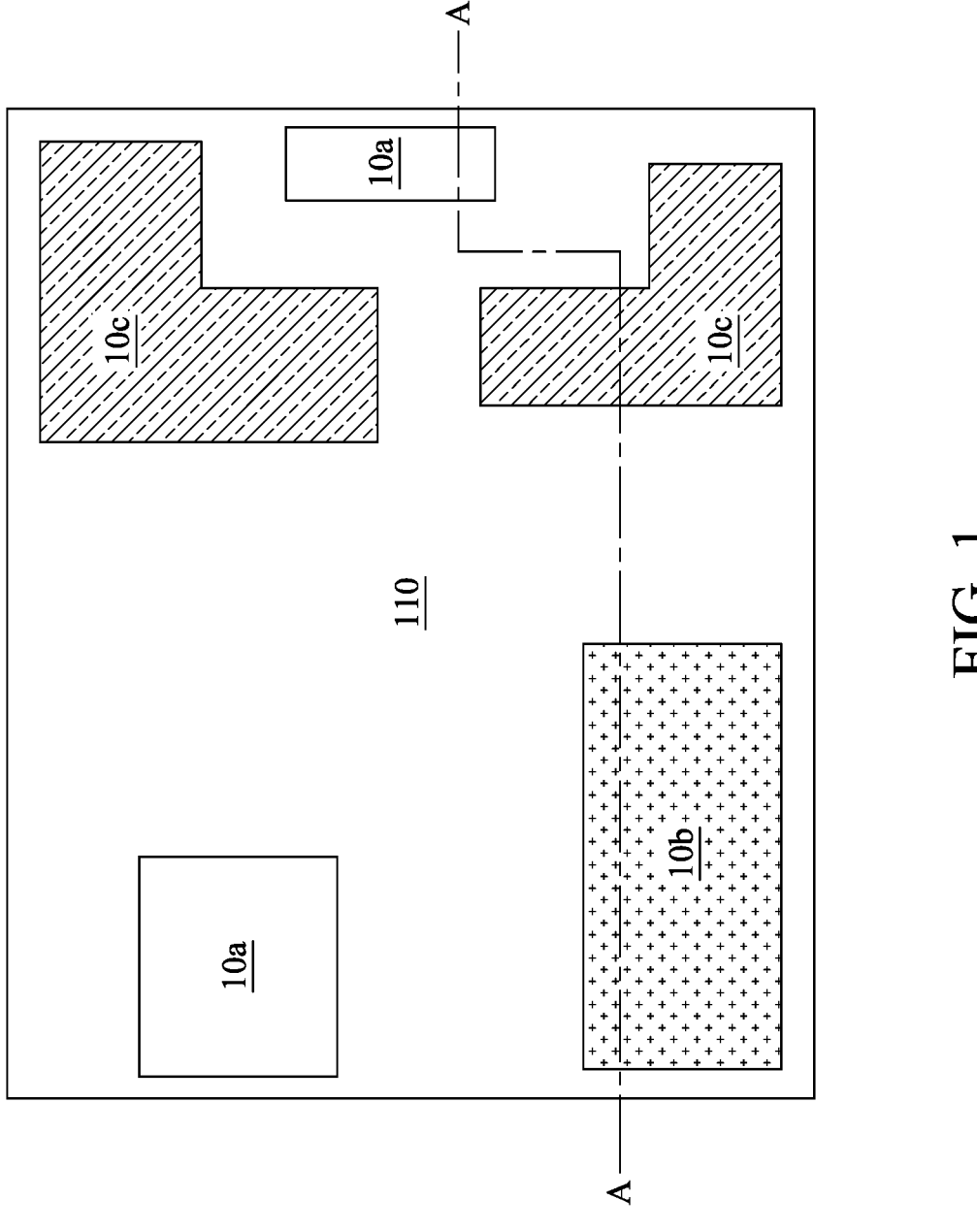
FIG. 1 is a top view of a layout of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 is a top view of a layout of a semiconductor device 10, in accordance with some embodiments of the present disclosure.

In some embodiments, the semiconductor device 10 may include an interposer 110. The interposer 110 may include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy may be formed over a silicon substrate. In some embodiments, the SiGe alloy may be mechanically strained by another material in contact with the SiGe alloy.

In some embodiments, the semiconductor device 10 may include at least one region 10a, at least one region 10b, and at least one region 10c on or within the interposer 110.

In some embodiments, the region 10a may be configured to support an electronic component which has a terminal (e.g., a conductive pad) connected to other devices by a conductive wire.

In some embodiments, the region 10b may be configured to accommodate a package structure or an electronic component(s) disposed within the interposer 110.

In some embodiments, the region 10c may be configured to form a through-insulation via (TIV), such as a through-oxide via (TOV), which may electrically connect two devices disposed on two opposite sides of the interposer 110.

Figure 2:
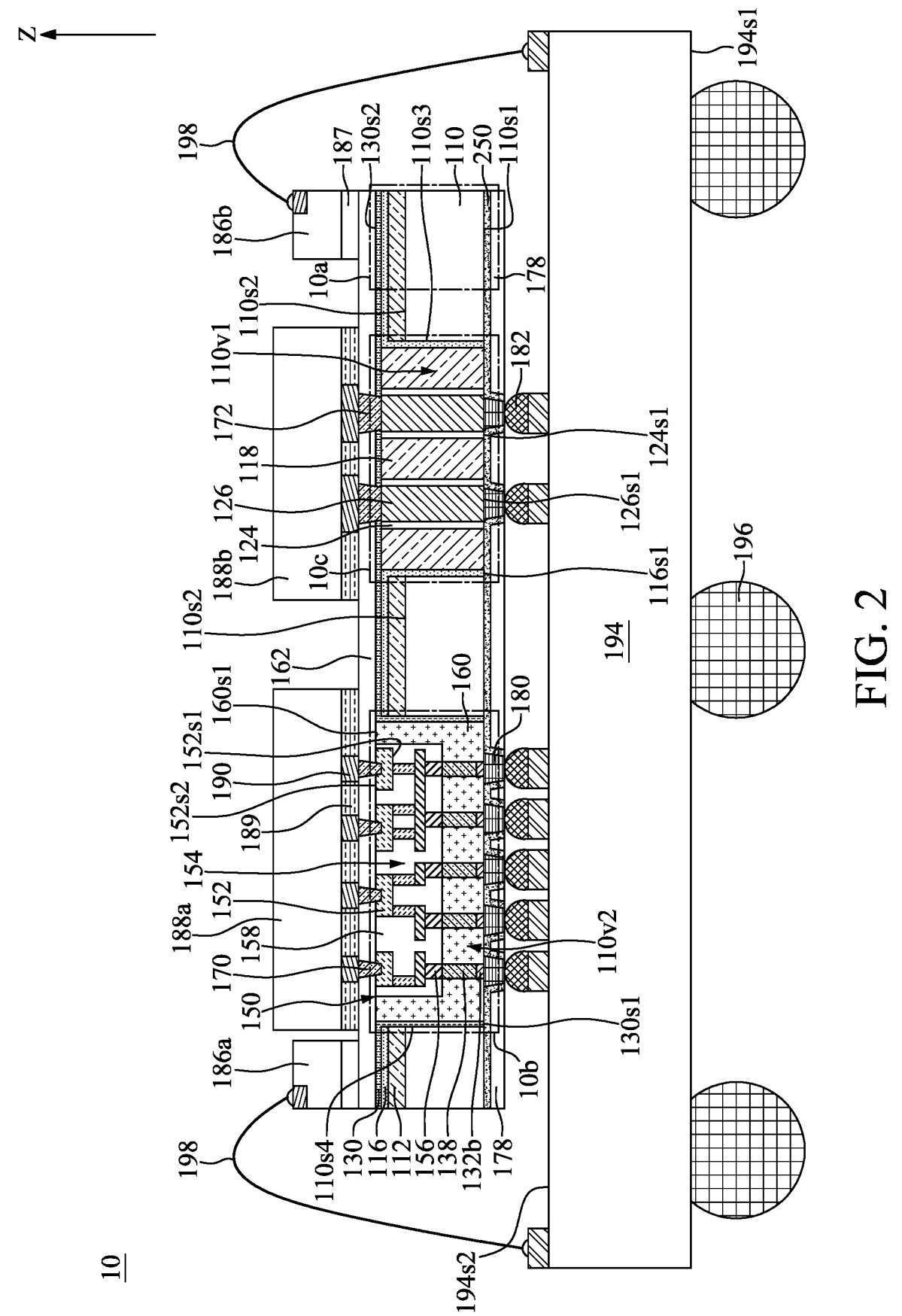
FIG. 2 is a cross-sectional view along line A-A' of the semiconductor device, in accordance with some embodiments of the present disclosure.
Figure 3:
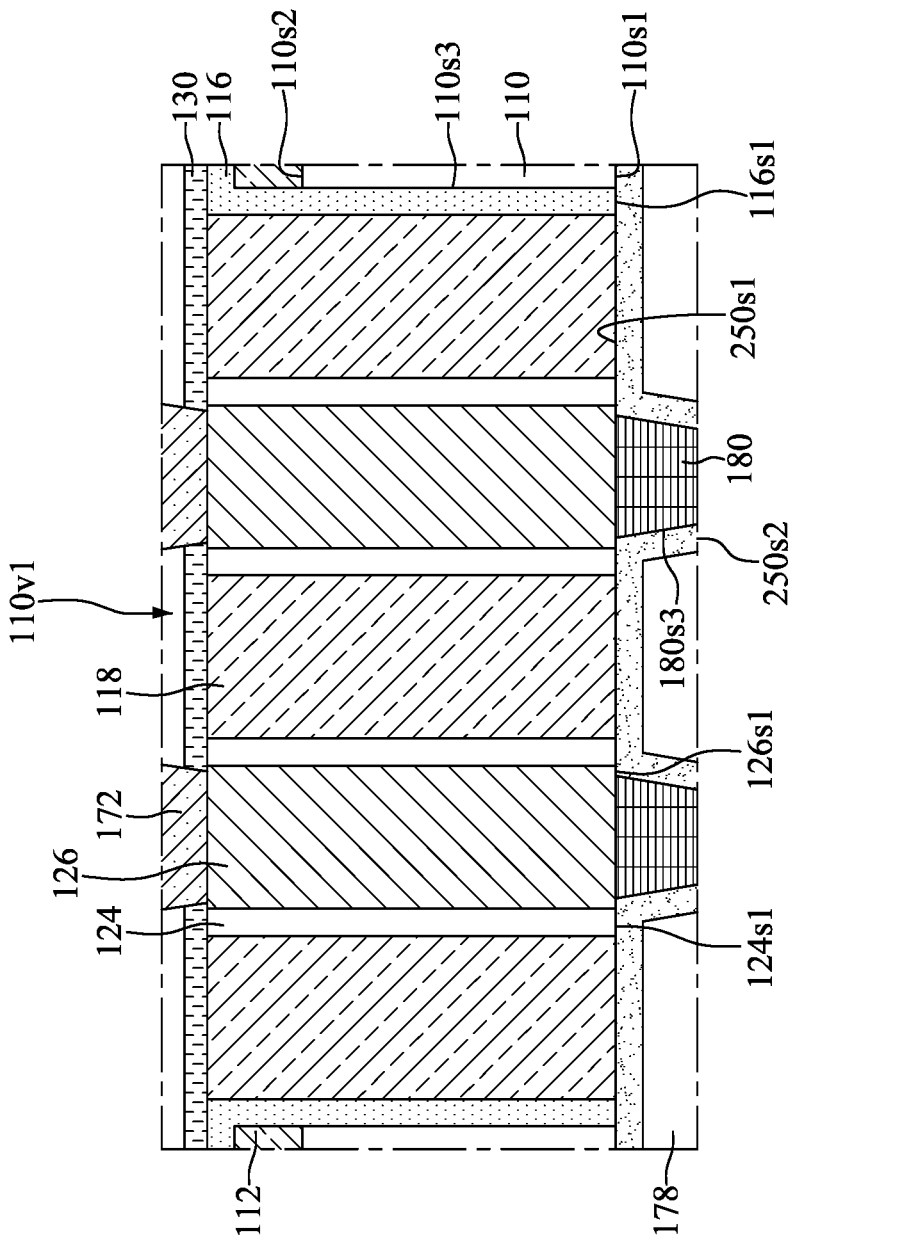
FIG. 3 and FIG. 4 are partial enlarged views of regions of FIG. 2.
Figure 4:
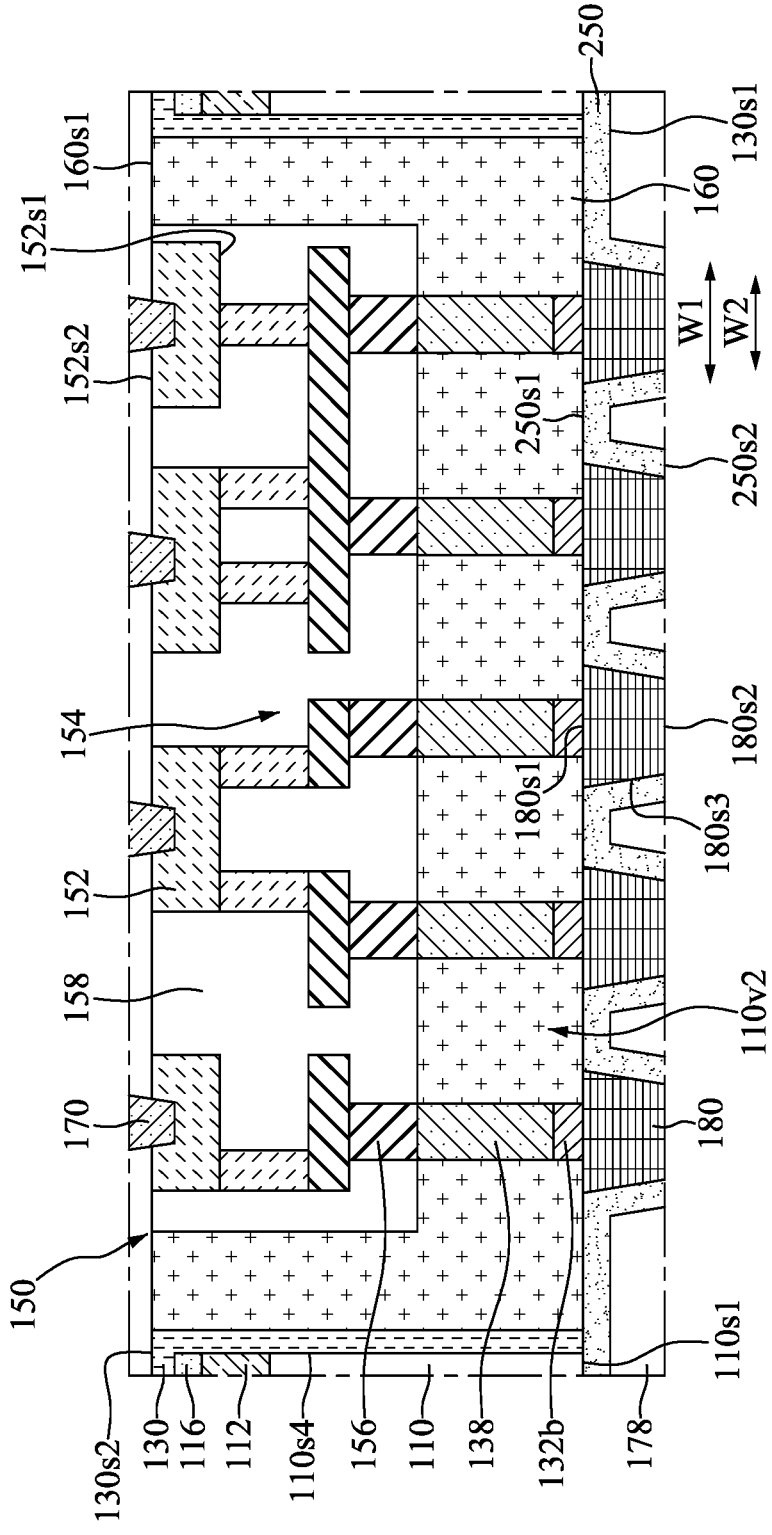

FIG. 2 is a cross-sectional view along line A-A' of the semiconductor device 10, in accordance with some embodiments of the present disclosure. FIG. 3 and FIG. 4 are partial enlarged views of the region 10c and the region 10b, respectively.

The interposer 110 (or substrate) may have a surface 110s1 (or a lower surface) and a surface 110s2 (or an upper surface) opposite to the surface 110s1. In other words, the surface 110s1 and the surface 110s2 may be parallel to each other.

The semiconductor device 10 may include a dielectric layer 112 and a protection layer 116. In some embodiments, the dielectric layer 112 may be disposed on the surface 110s2 of the interposer 110. In some embodiments, the protection layer 116 may be disposed on the dielectric layer 112. The protection layer 116 may be spaced apart from the interposer 110 by the dielectric layer 112. The dielectric layer 112 and the protection layer 116 may have different materials. Each of the dielectric layer 112 and the protection layer 116 may include silicon oxide (SiOx), silicon nitride (SixNy), silicon oxynitride (SiON), or a combination thereof. In some embodiments, the dielectric layer 112 may include or be made of silicon oxide. In some embodiments, the protection layer 116 may include or be made of silicon nitride. In some embodiments, the protection layer 116 may function as a polishing stop layer (e.g., chemical mechanical polishing (CMP) stop layer) or an etching stop layer.

The interposer 110 may define a cavity 110v1. In some embodiments, the cavity 110v1 may extend between the surface 110s1 and the surface 110s2 of the interposer 110. The protection layer 116 may be disposed on a surface 110s3 of the interposer 110 within the cavity 110v1. In some embodiments, the protection layer 116 may be in contact with the surface 110s3 of the interposer 110 within the cavity 110v1.

As shown in FIG. 3, the semiconductor device 10 may include an insulation layer 118. The insulation layer 118 may fill in the cavity 110v1 of the interposer 110. The insulation layer 118 may be spaced apart from the surface 110s3 of the interposer 110 by the protection layer 116. In some embodiments, the insulation layer 118 may penetrate the interposer 110. The insulation layer 118 may include silicon oxide, silicon nitride, silicon oxynitride, or a combination thereof. The insulation layer 118 and the protection layer 116 may include different materials. In some embodiments, the insulation layer 118 may include or be made of silicon oxide. The protection layer 116 may include a surface 116s1 (or a lower surface). In some embodiments, the surface 116s1 may be substantially coplanar with the surface 110s1 of the interposer 110.

The semiconductor device 10 may include a seed layer 124. The seed layer 124 may be disposed on a lateral surface of the insulation layer 118. The seed layer 124 may be spaced apart from the protection layer 116 by the insulation layer 118. The seed layer 124 may include conductive materials, such as tantalum nitride (TaN), titanium, titanium nitride (TiN), or other suitable materials. The seed layer 124 may include a surface 124s1 (or a lower surface). In some embodiments, the surface 124s1 may be substantially coplanar with the surface 110s1 of the interposer 110. In some embodiments, the surface 124s1 and the surface 116s1 may be located at the same elevation (or height).

The semiconductor device 10 may include a conductive via 126. The conductive via 126 may be disposed on a lateral surface of the seed layer 124. The conductive via 126 may be spaced apart from the insulation layer 118 by the seed layer 124. The protection layer 116 may be disposed between the conductive via 126 and the interposer 110. In some embodiments, the conductive via 126 may fully penetrate the interposer 110. The conductive via 126 may include conductive materials, such as copper (Cu), tungsten (W), silver (Ag), gold (Au), ruthenium (Ru), iridium (Ir), nickel (Ni), osmium (Os), rhodium (Rh), aluminum (Al), molybdenum (Mo), cobalt (Co), alloys thereof, combinations thereof or other suitable materials.

The conductive via 126 may include a surface 126s1 (or a lower surface). In some embodiments, the surface 126s1 may be substantially coplanar with the surface 124s1 of the seed layer 124. In some embodiments, the surface 126s1 and the surface 110s1 may be located at the same elevation (or height). In some embodiments, the conductive via 126 may also be referred to as a through-insulation via (TIV), such as a through-oxide via (TOV).

Referring back to FIG. 2, the semiconductor device 10 may include a protection layer 130. In some embodiments, the protection layer 130 may be disposed on the surface 110s2 of the interposer 110. In some embodiments, the protection layer 130 may be disposed on the dielectric layer 112. The protection layer 130 may be spaced apart from the interposer 110 by the dielectric layer 112. The protection layer 130 and the dielectric layer 112 may include different materials. The protection layer 130 may include silicon oxide, silicon nitride, silicon oxynitride, or other suitable materials. In some embodiments, the protection layer 130 may include or be made of silicon nitride. In some embodiments, the protection layer 130 may function as a polishing stop layer (e.g., CMP stop layer) or an etching stop layer. The protection layer 130 may include a surface 130s1 (or a lower surface) and a surface 130s2 (or an upper surface). In some embodiments, the surface 130s1 of the protection layer 130 may be substantially coplanar with the surface 110s1 of the interposer 110. In some embodiments, an elevation (or height) of the surface 130s1 of the protection layer 130 may be equal to that of the surface 116s1 of the protection layer 116. In some embodiments, an elevation (or height) of the surface 130s1 of the protection layer 130 may be equal to that of the surface 126s1 of the conductive via 126. In some embodiments, an elevation (or height) of the surface 130s1 of the protection layer 130 may be equal to that of the surface 124s1 of the seed layer 124.

The semiconductor device 10 may include a cavity 110v2. In some embodiments, the cavity 110v2 may extend between the surface 110s1 and the surface 110s2 of the interposer 110. The protection layer 130 may be disposed on a surface 110s4 of the interposer 110 within the cavity 110v2. In some embodiments, the protection layer 130 may be in contact with the surface 110s4 of the interposer 110 within the cavity 110v2.

As shown in FIG. 4, the semiconductor device 10 may include electrical connections 132b. In some embodiments, the electrical connection 132b may be disposed on the bottom of the cavity 110v2. The electrical connection 132b may be exposed from the surface 110s1 of the interposer 110. The electrical connection 132b may include solder material, such as alloys of gold and tin solder or alloys of silver and tin solder.

The semiconductor device 10 may include conductive pillars 138. In some embodiments, the conductive pillar 138 may be disposed on the electrical connection 132b. The conductive pillar 138 may be electrically connected to the electrical connection 132b. In some embodiments, the conductive pillar 138 may include or be made of conductive materials, Cu, W, Ag, Au, Ru, Ir, Ni, Os, Rh, Al, Mo, Co, alloys thereof, combinations thereof or other suitable materials.

The semiconductor device 10 may include a package structure 150. In some embodiments, the package structure 150 may be disposed within the cavity 110v2. The package structure 150 may include a plurality of electronic components 152, a redistribution structure 154, a plurality of conductive pads 156, and an encapsulant 158.

Each of the electronic components 152 may include a memory device, such as a dynamic random access memory (DRAM) device, a one-time programming (OTP) memory device, a static random access memory (SRAM) device, or other suitable memory devices. In some embodiments, the electronic component 152 may include a logic device (e.g., system-on-a-chip (SoC), central processing unit (CPU), graphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device)), a front-end device (e.g., analog front-end (AFE) devices) or other devices. The electronic component 152 may have a surface 152s1 (or a lower surface) and a surface 152s2 (or an upper surface) opposite to the surface 152s1. The surface 152s1 may face the surface 110s1 of the interposer 110.

The redistribution structure 154 may include conductive pad(s), trace(s), via(s), layer(s), or other interconnection(s) therein. For example, the redistribution structure 154 may include one or more transmission lines (e.g., communications cables) and one or more grounding lines and/or grounding planes therein.

The conductive pad 156 may be electrically connected to the redistribution structure 154. The conductive pad 156 may be electrically connected to the conductive pillar 138. In some embodiments, the conductive pad 156 may be bonded to the conductive pillar 138. In some embodiments, the conductive pad 156 may be exposed from the encapsulant 158. In some embodiments, the conductive pad 156 may include or be made of conductive materials, Cu, W, Ag, Au, Ru, Ir, Ni, Os, Rh, Al, Mo, Co, alloys thereof, combinations thereof or other suitable materials.

In some embodiments, the encapsulant 158 may encapsulate the electronic components 152. The encapsulant 158 may encapsulate the conductive pads 156. In some embodiments, the encapsulant 158 may be made of molding material that may include, for example, a Novolac-based resin, an epoxy-based resin, a silicone-based resin, or other suitable encapsulant. Suitable fillers may also be included, such as powdered $SiO_2$.

The semiconductor device 10 may include an encapsulant 160. In some embodiments, the encapsulant 160 may be disposed within the cavity 110v2 of the interposer 110. In some embodiments, the encapsulant 160 may encapsulate the package structure 150. In some embodiments, the encapsulant 160 may encapsulate the electronic components 152. In some embodiments, the encapsulant 160 may encapsulate the encapsulant 158. In some embodiments, the encapsulant 160 may encapsulate the conductive pillars 138. In some embodiments, the encapsulant 160 may encapsulate the electrical connections 132b. In some embodiments, the encapsulant 160 may be in contact with the protection layer 130. In some embodiments, the encapsulant 160 may be spaced apart from the interposer 110 by the protection layer 130. In some embodiments, the encapsulant 160 may penetrate the interposer 110. In some embodiments, the encapsulant 160 may fully penetrate the interposer 110. In some embodiments, the encapsulant 160 may be made of molding material that may include, for example, a Novolac-based resin, an epoxy-based resin, a silicone-based resin, or other suitable encapsulant. Suitable fillers may also be included, such as powdered $SiO_2$. The encapsulant 160 may have a surface 160s1 (or upper surface). In some embodiments, the surface 160s1 of the encapsulant 160 may be substantially coplanar with the surface 130s2 of the protection layer 130.

Referring back to FIG. 2, the semiconductor device 10 may include a dielectric layer 162. The dielectric layer 162 may be disposed on the surface 110s2 of the interposer 110. The dielectric layer 162 may be disposed on the protection layer 130. The dielectric layer 162 may be disposed on the encapsulant 160. The dielectric layer 162 may include a dielectric material such as silicon oxide, silicon nitride, silicon oxynitride, fluoride-doped silicate (FSG), a low-k dielectric material, combinations thereof, and/or other suitable materials. In some embodiments, the material of the dielectric layer 162 may be the same as that of the protection layer 130.

The semiconductor device 10 may include conductive elements 170. In some embodiments, the conductive element 170 may penetrate the dielectric layer 162. In some embodiments, the conductive element 170 may penetrate a portion of the electronic component 152. In some embodiments, the conductive element 170 may penetrate the electronic component 152 from the surface 152s2. In some embodiments, the conductive element 170 may be electrically connected to the electronic component 152. In some embodiments, the conductive element 170 may be tapered toward the interposer 110. The conductive element 170 may include or be made of conductive materials, Cu, W, Ag, Au, Ru, Ir, Ni, Os, Rh, Al, Mo, Co, alloys thereof, combinations thereof or other suitable materials.

The semiconductor device 10 may include conductive elements 172. In some embodiments, the conductive element 172 may penetrate the dielectric layer 162. In some embodiments, the conductive element 172 may penetrate the protection layer 130. In some embodiments, the conductive element 172 may be electrically connected to the conductive via 126. In some embodiments, the conductive element 172 may be tapered toward the interposer 110. In some embodiments, the conductive element 170 and conductive element 172 may be located at the same elevation (or height). In some embodiments, the conductive element 170 and conductive element 172 may have different dimensions (e.g., length, width, or area). The conductive element 172 may include or be made of conductive materials, Cu, W, Ag, Au, Ru, Ir, Ni, Os, Rh, Al, Mo, Co, alloys thereof, combinations thereof or other suitable materials.

The semiconductor device 10 may include a passivation layer 178. The passivation layer 178 may be disposed on the surface 110s1 of the interposer 110. The passivation layer 178 may include a dielectric material, such as polyimide-isoindoloquinazolinedione (PIQ), polybenzoxazole (PBO), benzocyclobutene (BCB), or other suitable materials.

As shown in FIG. 4, the semiconductor device 10 may include conductive elements 180. In some embodiments, the conductive element 180 may penetrate the passivation layer 178. In some embodiments, the conductive element 180 may be disposed on the surface 110s1 of the interposer 110. In some embodiments, the conductive element 180 may be electrically connected to the electrical connection 132b. In some embodiments, the conductive element 180 may be electrically connected to the conductive via 126. Detailedly, the conductive element 180 may have a surface 180s1 (or upper surface) and a surface 180s2 (or lower surface). The width W1 of the surface 180s1 may be greater than or equal to the width W2 of the surface 180s2. The conductive element 180 may include or be made of conductive materials, Cu, W, Ag, Au, Ru, Ir, Ni, Os, Rh, Al, Mo, Co, alloys thereof, combinations thereof or other suitable materials.

As shown in FIGS. 2 to 4, the semiconductor device 10 may include spacers 250. In some embodiments, the spacer 250 may be conformally disposed on the surface 110s1 of the interposer 110 to separate the interposer 110 and the passivation layer 178. In some embodiments, the spacer 250 may be conformally disposed on the insulation layer 118 to separate the insulation layer 118 and the passivation layer 178. In some embodiments, the spacer 250 may be conformally disposed on the encapsulant 160 to separate the encapsulant 160 and the passivation layer 178. In some embodiments, the spacer 250 may be conformally disposed on sidewalls 180s3 of the conductive elements 180 to laterally separate the conductive elements 180 and the passivation layer 178.

In some embodiments, the spacer 250 may have a surface 250s1 (or upper surface) and a surface 250s2 (or lower surface). In some embodiments, the surface 250s1 may be substantially coplanar with the surface 116s1 of the protection layer 116. In some embodiments, the surface 250s1 may be substantially coplanar with the surface 110s1 of the interposer 110. In some embodiments, the surface 250s1 may be substantially coplanar with the surface 124s1 of the seed layer 124. In some embodiments, the surface 250s1 may be substantially coplanar with the surface 126s1 of the conductive via 126. In some embodiments, the surface 250s1 may be substantially coplanar with the surface 180s1 of the conductive element 180. In some embodiments, the surface 250s1 may be substantially coplanar with the surface 130s1 of the protection layer 130. In some embodiments, the surface 250s2 may be substantially coplanar with the surface 180s2 of the conductive element 180.

In some embodiments, the spacers 250 and the passivation layer 178, separating the conductive elements 180 from each other, have different dielectric constants. Detailedly, the passivation layer 178 can have a first dielectric constant, and the spacers 250 can have a second dielectric constant less than the first dielectric constant. Consequently, an effective dielectric constant of the dielectric layer combining the passivation layer 178 with the spacers 250 can be reduced, thereby reducing resistance-capacitance (RC) delay of the semiconductor device 10. In some embodiments, the spacers 250 and the passivation layer 178 may include oxide-based dielectrics. For example, the spacers 250 may include low-k oxide-based dielectrics, such as carbon-doped silicon oxide or fluorinated oxide, and the passivation layer 178 may include silicon oxide or silicon dioxide.

The semiconductor device 10 may include electrical connections 182. The electrical connection 182 may be electrically connected to the conductive element 180. The electrical connection 182 may include solder material, such as alloys of gold and tin solder or alloys of silver and tin solder.

The semiconductor device 10 may include electronic component 186a and electronic component 186b. In some embodiments, the electronic component 186a and the electronic component 186b may be disposed on the region 10a. In some embodiments, the electronic component 186a and the electronic component 186b may be disposed on the surface 110s2 of the interposer 110. In some embodiments, the electronic component 186a and the electronic component 186b may be free from overlapping the cavity 110v1 and the cavity 110v2. The electronic component 186a may be attached to the surface 110s2 through an adhesive layer 187. In some embodiments, the active surface (not annotated) of the electronic component 186a (or the electronic component 186b) may face away from the interposer 110. Each of the electronic component 186a and the electronic component 186b may include a memory device, such as a dynamic random access memory (DRAM) device, a one-time programming (OTP) memory device, a static random access memory (SRAM) device, or other suitable memory devices. In some embodiments, each of the electronic component 186a and the electronic component 186b may include a logic device (e.g., system-on-a-chip (SoC), central processing unit (CPU), graphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device)), a front-end device (e.g., analog front-end (AFE) devices) or other devices.

The semiconductor device 10 may include electronic component 188a and the electronic component 188b. In some embodiments, the electronic component 188a and the electronic component 188b may be disposed on the surface 110s2 of the interposer 110. In some embodiments, the electronic component 188a may be disposed on or above the region 10b. In some embodiments, the electronic component 188a may be electrically connected to the electronic component 152. In some embodiments, the electronic component 188a may be disposed directly above the package structure 150. In some embodiments, the electronic component 188b may be disposed on or above the region 10c. In some embodiments, the electronic component 188b may be electrically connected to the conductive via 126. In some embodiments, the electronic component 188b may be disposed directly over the conductive via 126. In some embodiments, the active surface (not annotated) of the electronic component 188a (or the electronic component 188b) may face the interposer 110. Each of the electronic component 188a and the electronic component 188b may include a memory device, such as a dynamic random access memory (DRAM) device, a one-time programming (OTP) memory device, a static random access memory (SRAM) device, or other suitable memory devices. In some embodiments, each of the electronic component 188a and the electronic component 188b may include a logic device (e.g., system-on-a-chip (SoC), central processing unit (CPU), graphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device)), a front-end device (e.g., analog front-end (AFE) devices) or other devices.

The semiconductor device 10 may include a passivation layer 189. The passivation layer 189 may be disposed on the active surface of the electronic component 188a (or the electronic component 188b). The passivation layer 189 may include a dielectric material such as PIQ, PBO, BCB, or other suitable materials.

The semiconductor device 10 may include conductive elements 190. In some embodiments, the conductive element 190 may be electrically connected to the electronic component 188a (or the electronic component 188b). In some embodiments, the conductive element 190 may be electrically connected to the conductive element 170. The conductive element 190 may penetrate the passivation layer 189. The conductive element 190 may include or be made of conductive materials, Cu, W, Ag, Au, Ru, Ir, Ni, Os, Rh, Al, Mo, Co, alloys thereof, combinations thereof or other suitable materials.

The semiconductor device 10 may include a mother board 194. The mother board 194 may be disposed on the surface 110s1 of the interposer 110. The mother board 194 may be electrically connected to the electronic component 188a through the package structure 150. The mother board 194 may be electrically connected to the electronic component 188b through the conductive via 126. The mother board 194 may be electrically connected to the electronic component 186a (or the electronic component 186b). The mother board 194 may be formed of, for example, a printed circuit board, such as a paper-based copper foil laminate, a composite copper foil laminate, or a polymer-impregnated glass-fiber-based copper foil laminate. The mother board 194 may include a redistribution layer (RDL) or traces for electrical connection between components. The mother board 194 may have a surface 194s1 (or a lower surface) and a surface 194s2 (or an upper surface) opposite to the surface 194s1. The surface 194s2 of the mother board 194 may face the interposer 110.

The semiconductor device 10 may include electrical connections 196. The electrical connection 196 may be disposed on the surface 194s1 of the mother board 194. Each of the electrical connections 196 may be electrically connected to an external device (not shown). The electrical connection 196 may include solder material, such as alloys of gold and tin solder or alloys of silver and tin solder.

The semiconductor device 10 may include conductive wires 198. In some embodiments, the conductive wire 198 may be configured to electrically connect the electronic component 186a (or the electronic component 186b) to the mother board 194. The conductive wire 198 may be connected to the surface 194s2 of the mother board 194.

In a comparative semiconductor device, a TSV is disposed within an interposer to electrically connect devices on opposite surfaces of the interposer. When the size of the semiconductor device is reduced, it becomes more difficult to control the depth of the TSV. Further, the parasitic capacitance of the TSV may adversely affect the performance of the semiconductor device. In this embodiment, the semiconductor device 10 includes a TIV (e.g., conductive via 126). The TIV may penetrate the interposer. The TIV has a relatively small parasitic capacitance in comparison with a TSV. Further the depth of the TIV may be controlled by determining the depth of the cavity (e.g., 110v1), and the protection layer (e.g., 116) may prevent the interposer 110 from being over polished. As a result, the depth of the TIV may be relatively well controlled in comparison with the TSV.

Figure 5:
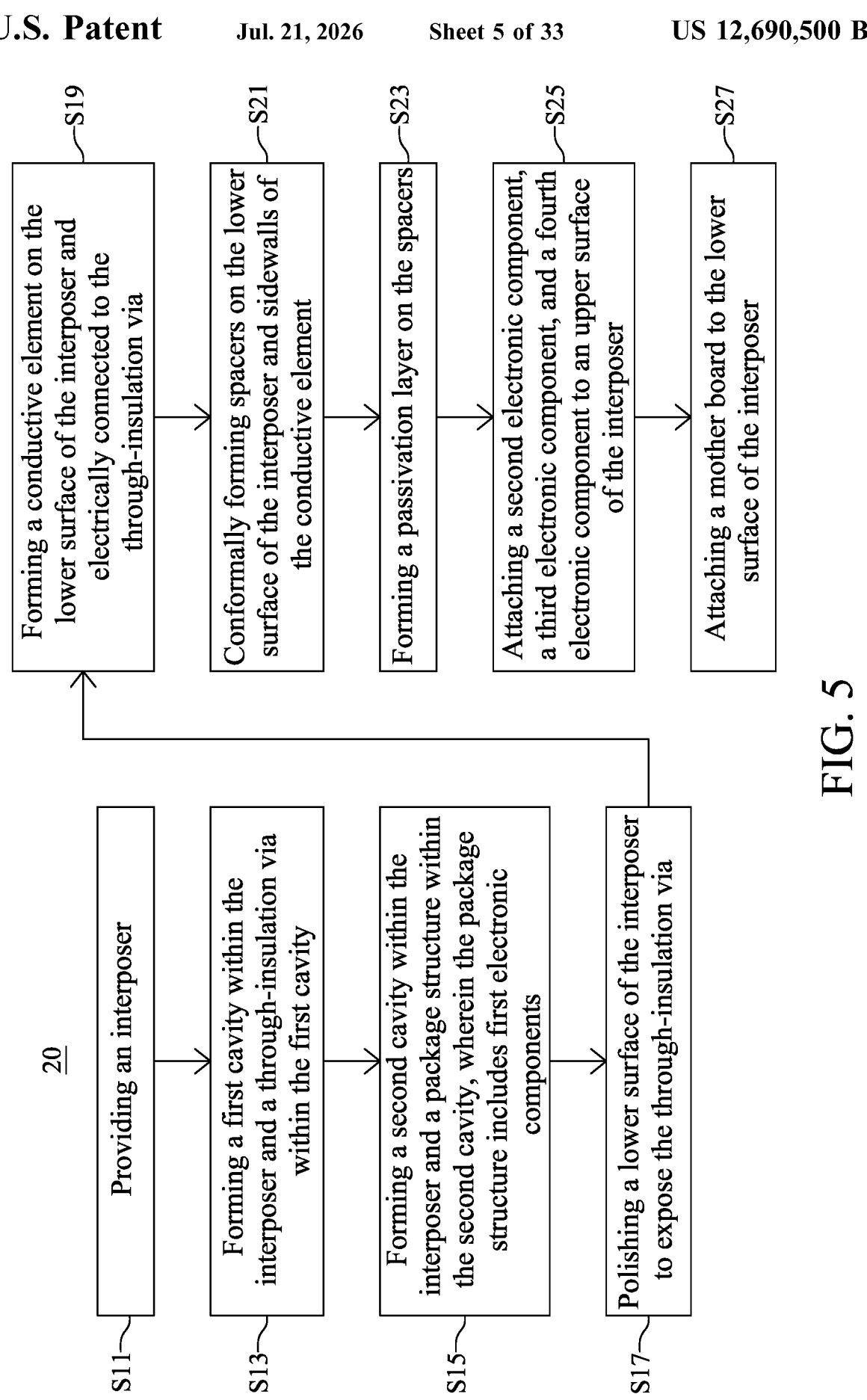
FIG. 5 is a flowchart illustrating a method of manufacturing a semiconductor device, in accordance with various aspects of the present disclosure.

FIG. 5 is a flowchart illustrating a method 20 of manufacturing a semiconductor device, in accordance with various aspects of the present disclosure.

The method 20 begins with operation S11 in which an interposer is provided. The interposer has a lower surface and an upper surface.

The method 20 continues with operation S13 in which a first cavity may be formed within the interposer. A first protection layer may be formed within the first cavity. A TIV may be formed within the first cavity.

The method 20 continues with operation S15 in which a second cavity may be formed within the interposer. A second protection layer may be formed within the second cavity. A package structure, including first electronic components, may be disposed within the second cavity.

The method 20 continues with operation S17 in which a polishing technique may be performed to remove a portion of the lower surface of the interposer, the first protection layer, and the second protection layer to expose the TIV.

The method 20 continues with operation S19 in which a conductive element may be formed on the lower surface of the interposer and electrically connected to the TIV.

The method 20 continues with operation S21 in which spaces are conformally formed on the lower surface of the interposer and sidewalls of the conductive element.

The method 20 continues with operation S23 in which a passivation layer may be formed on the spacers. The passivation layer may have different dielectric constant from the spacers.

The method 20 continues with operation S25 in which a second electronic component, a third electronic component, and a fourth electronic component are attached to the upper surface of the interposer. The second electronic component may be electrically connected to the TIV. The third electronic component may be electrically connected to the package structure.

The method 20 continues with operation S27 in which a mother board is attached to the lower surface of the interposer. A conductive wire is formed to electrically connect the fourth electronic component and the mother board.

The method 20 is merely an example and is not intended to limit the present disclosure beyond what is explicitly recited in the claims. Additional operations can be provided before, during, or after each operation of the method 20, and some operations described can be replaced, eliminated, or reordered for additional embodiments of the method. In some embodiments, the method 20 can include further operations not depicted in FIG. 5. In some embodiments, the method 20 can include one or more operations depicted in FIG. 5.

Figure 6:
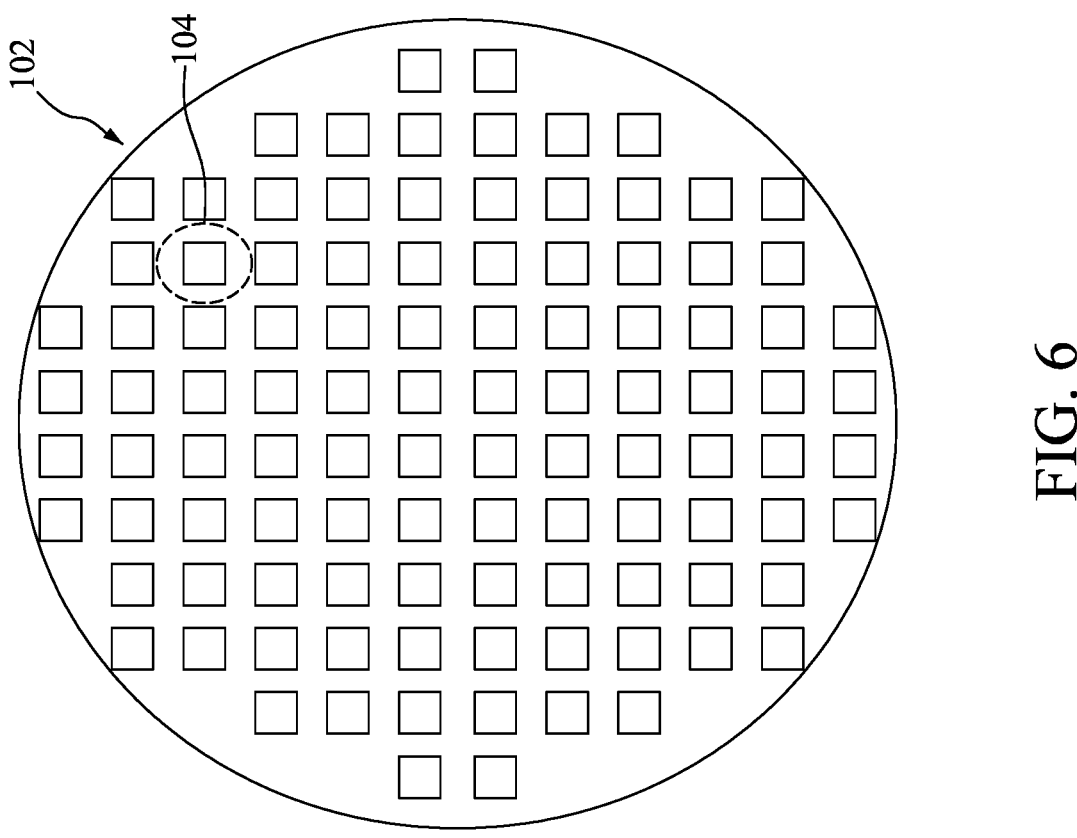
FIG. 6 is a top view of a wafer, in accordance with some embodiments of the present disclosure.

FIG. 6 is a top view of a wafer, in accordance with some embodiments of the present disclosure. The wafer 102 may be sawed along scribe lines into a plurality of regions 104. Each of the regions 104 may correspond to a semiconductor die after the wafer 102 is sawed. The region 104 may include a substrate (or an interposer), and a plurality of active components and/or passive components may be attached to or formed on the substrate. The active component may include a memory die (e.g., dynamic random access memory (DRAM) die, a static random access memory (SRAM) die, etc.)), a power management die (e.g., power management integrated circuit (PMIC) die)), a logic die (e.g., system-on-a-chip (SoC), central processing unit (CPU), graphics processing unit (GPU), application processor (AP), microcontroller, etc.)), a radio frequency (RF) die, a sensor die, a micro-electro-mechanical-system (MEMS) die, a signal processing die (e.g., digital signal processing (DSP) die)), a front-end die (e.g., analog front-end (AFE) dies)) or other active components. The passive component may include a capacitor, a resistor, an inductor, a fuse or other passive components.

Figure 32:
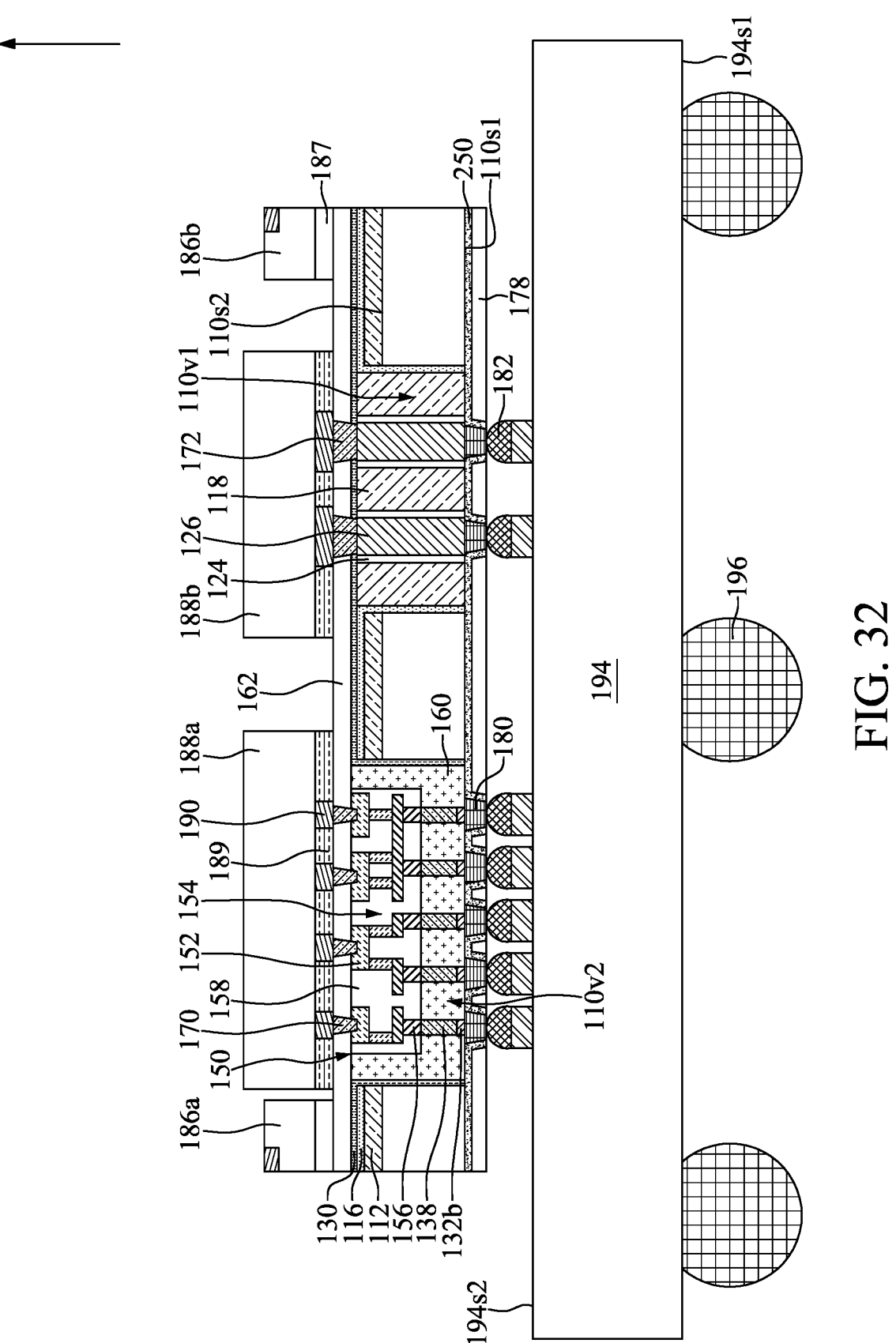
Figure 33:
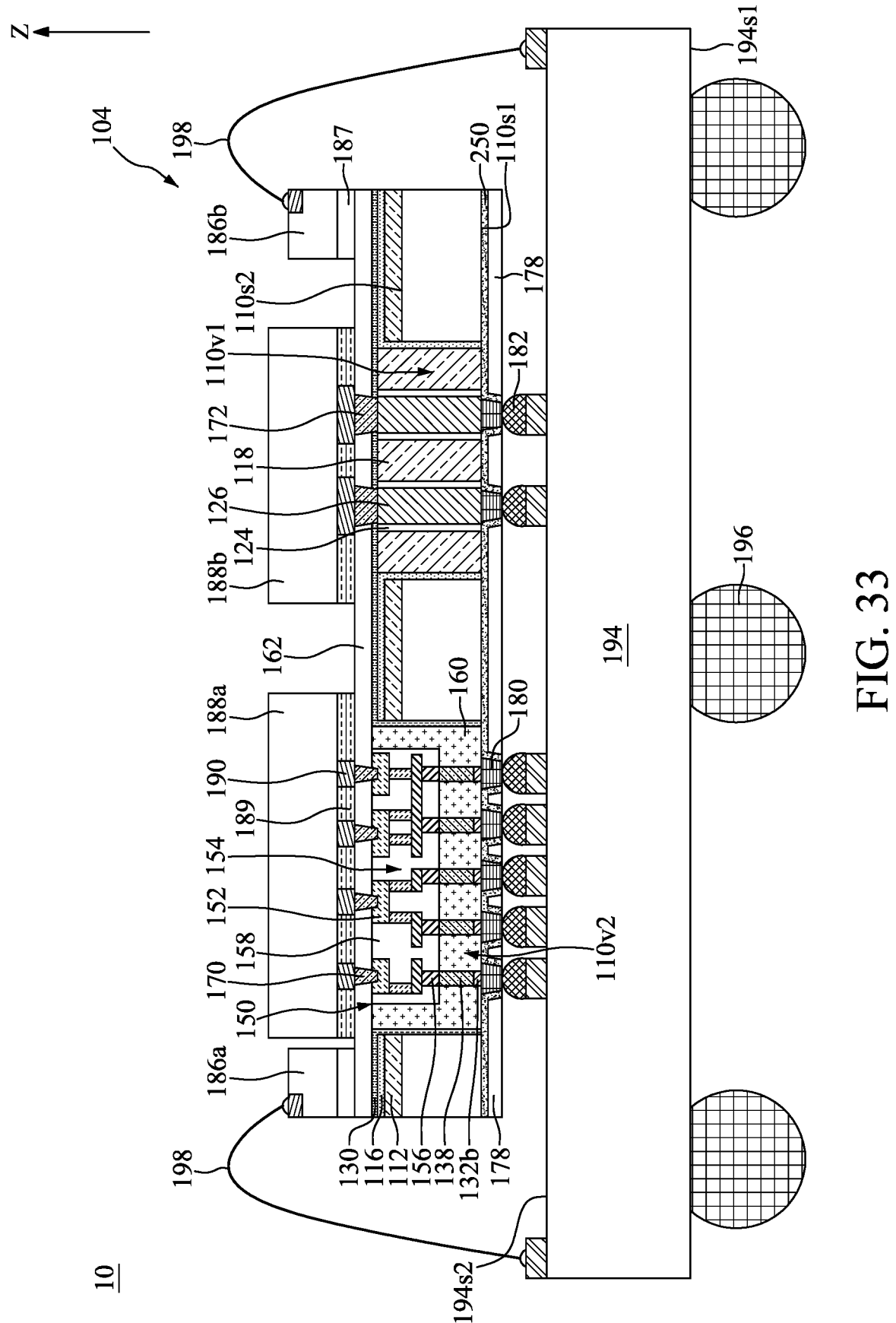

FIG. 7 to FIG. 33 illustrate one or more various stages of manufacturing a semiconductor device 10 as shown in FIG. 2, in accordance with some embodiments of the present disclosure. FIG. 7 to FIG. 31 illustrate cross-sectional views of the region 104 at the stages before the wafer 102 is sawed. FIG. 32 and FIG. 33 illustrate cross-sectional views of the region 104 at the stages after the wafer 102 is sawed.

Figure 7:
FIG. 7 to FIG. 33 illustrate one or more various stages of manufacturing the semiconductor device as shown in FIG. 2, in accordance with some embodiments of the present disclosure.
Figure 7:
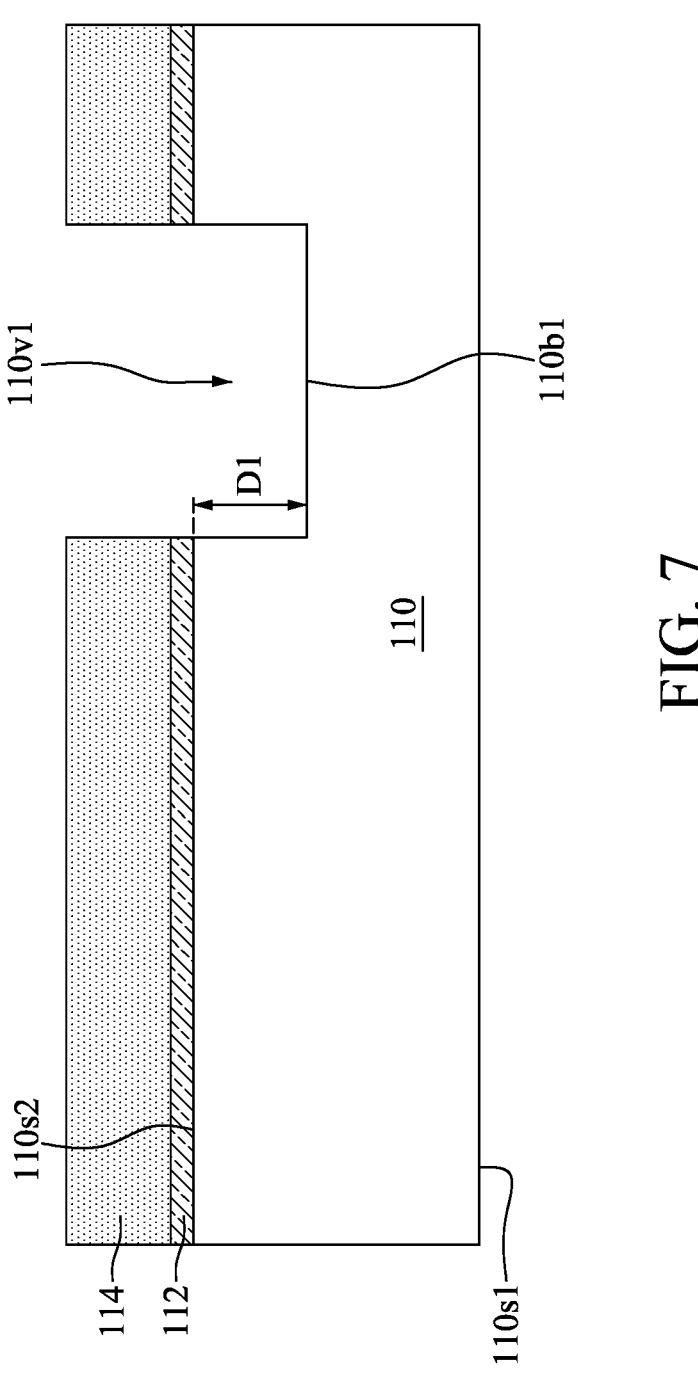

Referring to FIG. 7, an interposer 110 may be provided. The interposer 110 may have a surface 110s1 and a surface 110s2. In some embodiments, a dielectric layer 112 may be formed on the surface 110s2 of the interposer 110. The dielectric layer 112 may be formed by chemical vapor deposition (CVD), atomic layer deposition (ALD), physical vapor deposition (PVD), or other suitable techniques. In some embodiments, a mask 114 may be formed on the dielectric layer 112. The mask 114 may include a positive-tone or negative-tone photoresist such as a polymer. The mask 114 may be patterned to have an opening, which may be configured to define a cavity 110v1 of the interposer 110. In some embodiments, a photolithography technique and an etching technique may be performed to remove a portion of the interposer 110. In some embodiments, the cavity 110v1 may be recessed from the surface 110s2 of the interposer 110. The cavity 110v1 may have a depth D1 between the surface 110s2 of the interposer 110 and the bottom 110b1 of the cavity 110v1.

Figure 8:
Figure 8:
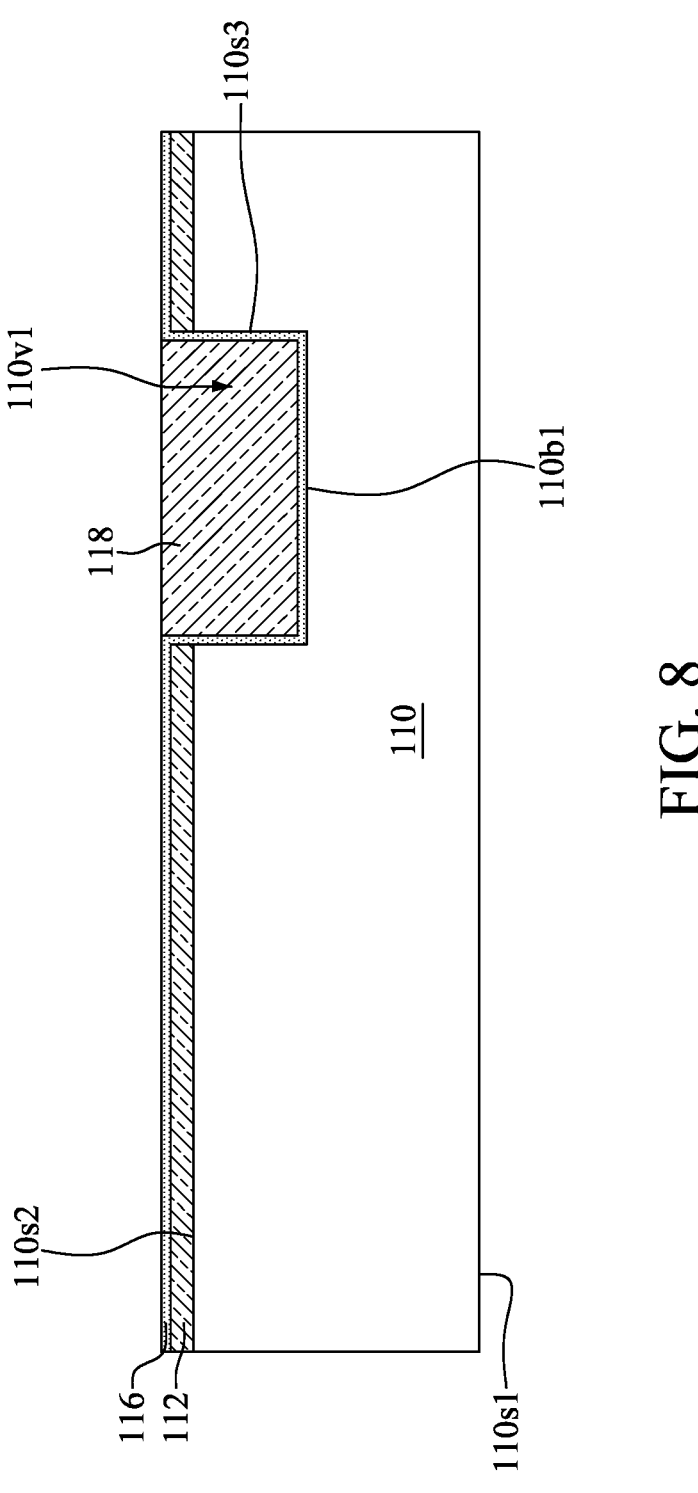

Referring to FIG. 8, the mask 114 may be removed, and a protection layer 116 may be formed on the dielectric layer 112. The protection layer 116 may be formed on the surface 110s2 of the interposer 110. The protection layer 116 may be formed on the surface 110s3 of the interposer 110. The protection layer 116 may be formed on the bottom 110b1 of the cavity 110v1. An insulation layer 118 may be formed on the protection layer 116 and fill the cavity 110v1. Each of the protection layer 116 and insulation layer 118 may be formed by CVD, ALD, PVD, or other suitable techniques. In some embodiments, a polishing technique, such as a chemical mechanical polishing (CMP) may be performed on the insulation layer 118 to expose the protection layer 116.

Figure 9:
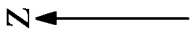
Figure 9:
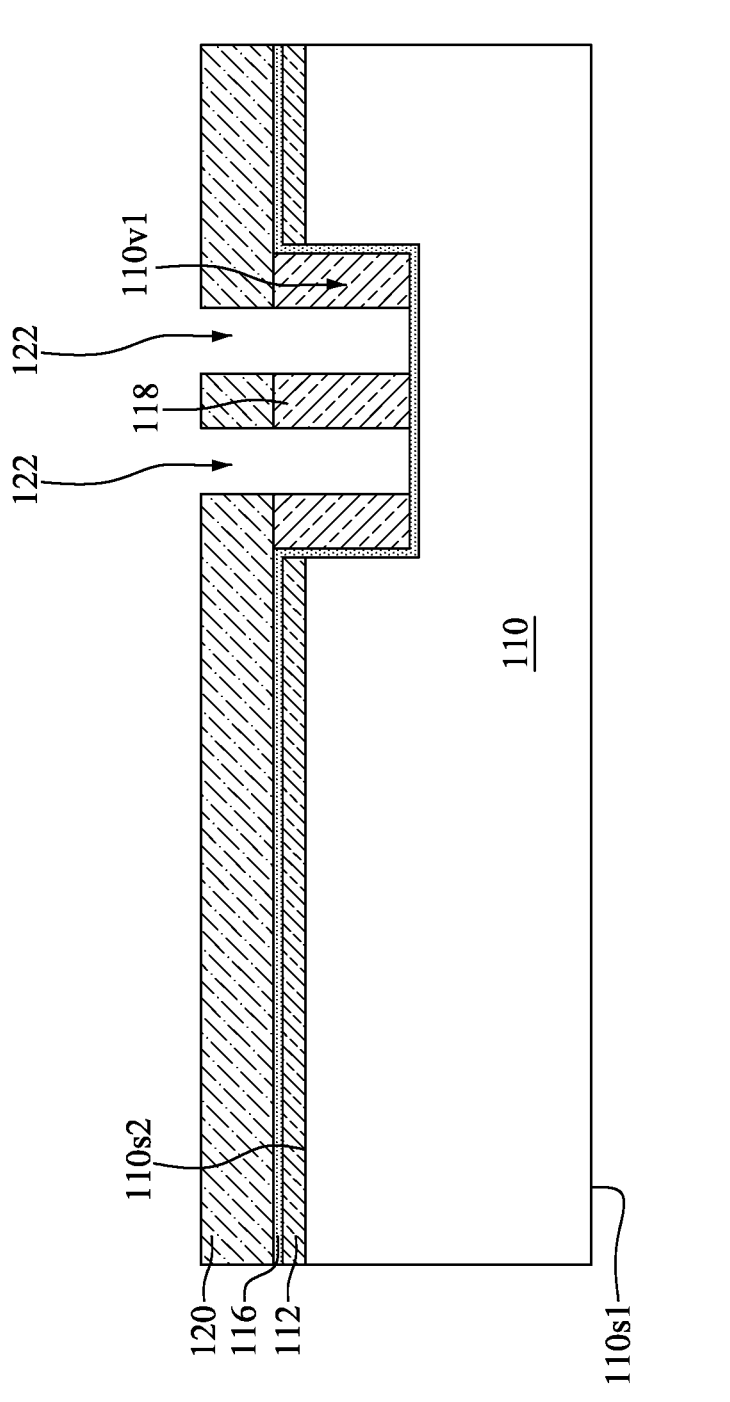

Referring to FIG. 9, a mask 120 may be formed over the protection layer 116 and the insulation layer 118. The mask 120 may include a positive-tone or negative-tone photoresist such as a polymer. The mask 120 may be patterned to form openings 122. Each of the openings 122 may penetrate the insulation layer 118. The opening 122 may be configured to define the region of a TIV or a TOV.

Figure 10:
Figure 10:
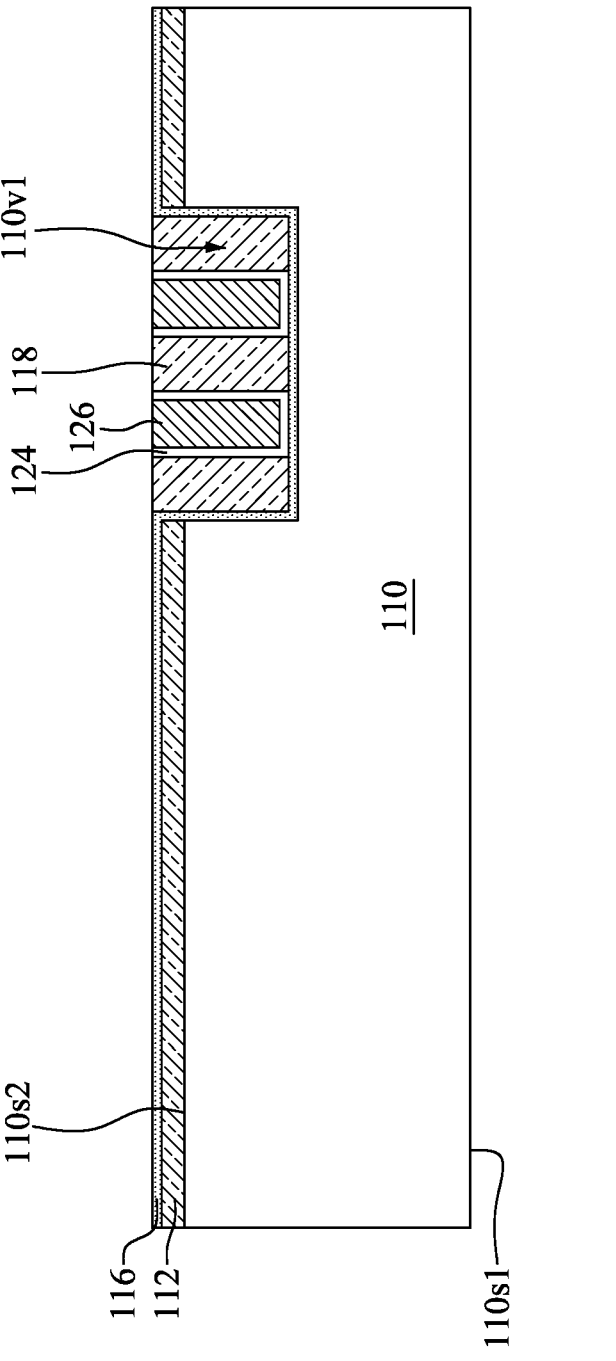

Referring to FIG. 10, a seed layer 124 may be formed within the opening 122 as shown in FIG. 9. The seed layer 124 may be in contact with the insulation layer 118. The conductive via 126 may be formed within the opening 122 as shown in FIG. 9. The conductive via 126 may be formed on the seed layer 124. Each of the conductive via 126 and the seed layer 124 may be formed by CVD, ALD, PVD, electroplating, or other suitable techniques. In some embodiments, the conductive via 126 and the insulation layer 118 may define a TIV. In some embodiments, the conductive via 126 may be formed of (Cu), tungsten (W), silver (Ag), gold (Au), ruthenium (Ru), iridium (Ir), nickel (Ni), osmium (Os), rhodium (Rh), aluminum (Al), molybdenum (Mo), cobalt (Co), alloys thereof, combinations thereof or other suitable materials. In some embodiments, the conductive via 126 and the insulation layer 118 define a TOV. In some embodiments, the conductive via 126 and the seed layer 124 may be formed of the same material.

Figure 11:
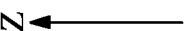
Figure 11:
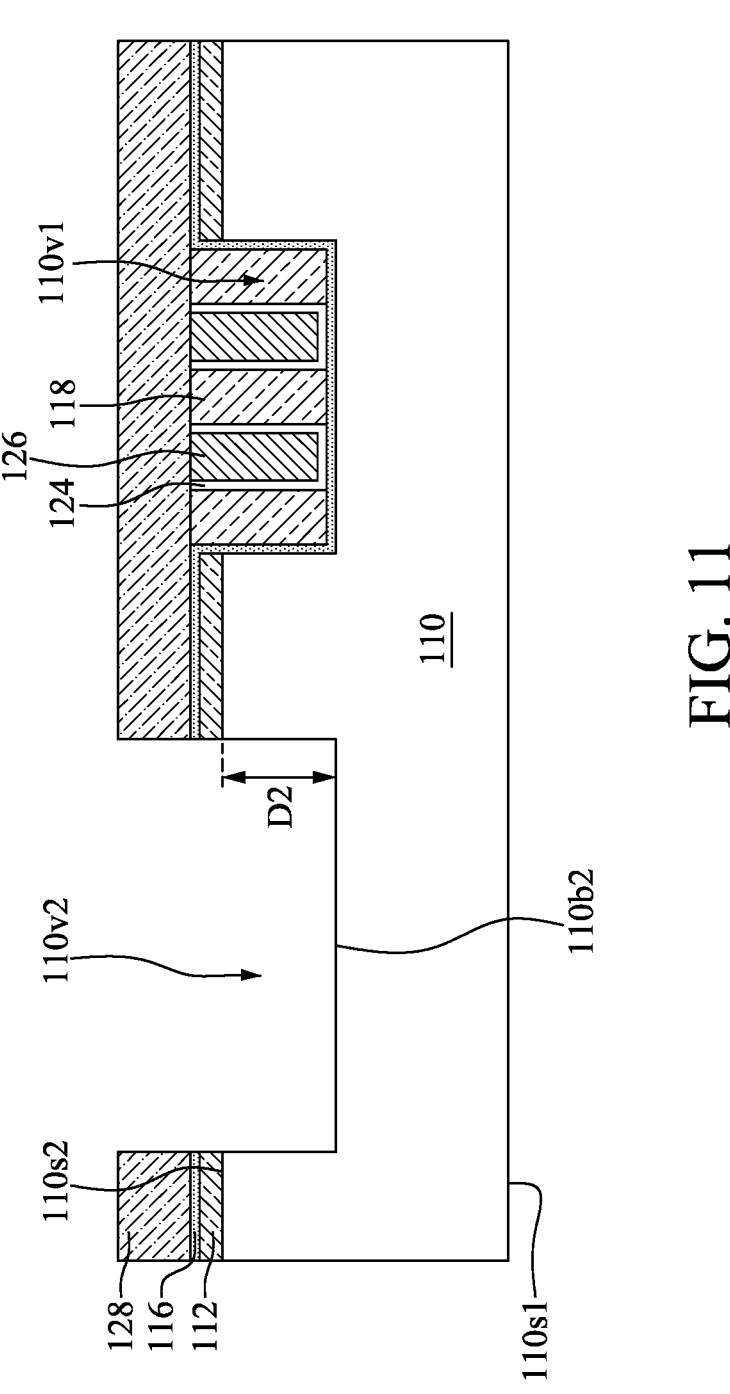

Referring to FIG. 11, a mask 128 may be formed on the protection layer 116. The mask 128 may cover the conductive via 126. The mask 128 may include a positive-tone or negative-tone photoresist such as a polymer. The mask 128 may be patterned to have an opening, which may be configured to define a cavity 110v2 of the interposer 110. In some embodiments, a photolithography technique and an etching technique may be performed to remove a portion of the interposer 110 to form the cavity 110v2. In some embodiments, the cavity 110v2 may be recessed from the surface 110s2 of the interposer 110. The cavity 110v2 may have a depth D2 between the surface 110s2 and the bottom 110b2 of the cavity 110v2. In some embodiments, the depth D1 (as shown in FIG. 7) may be substantially equal to the depth D2.

Figure 12:
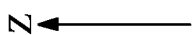
Figure 12:
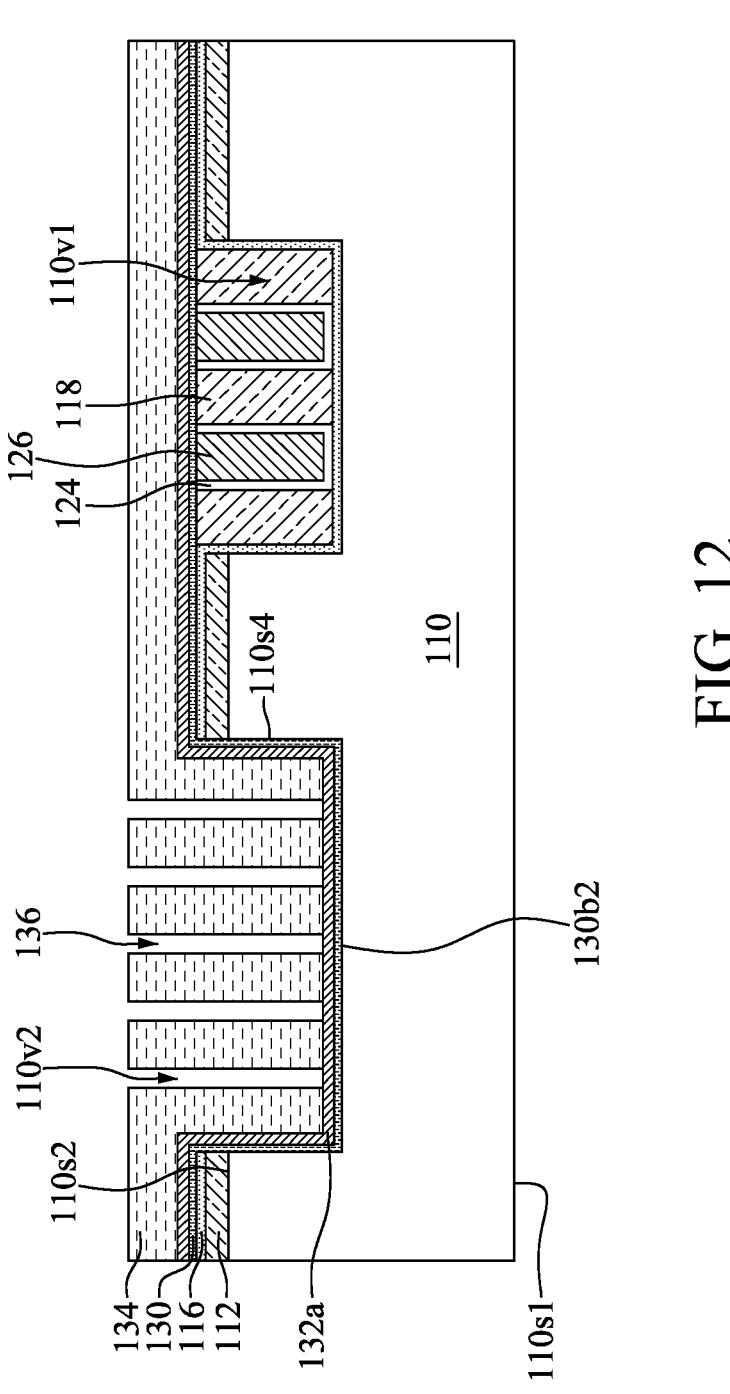

Referring to FIG. 12, the mask 128 may be removed, and a protection layer 130 may be formed on the protection layer 116. The protection layer 130 may be formed on the surface 110s2 of the interposer 110. The protection layer 130 may be formed on the surface 110s4 of the interposer 110. The protection layer 130 may be formed on the bottom 110b2 of the cavity 110v2. A conductive material 132a may be formed to fill the cavity 110v2. The conductive material 132a may include solder materials, such as alloys of gold and tin solder or alloys of silver and tin solder. The protection layer 130 may be formed by CVD, ALD, PVD, or other suitable techniques. The conductive material 132a may be formed by, for example, a coating technique, or other suitable techniques. A mask 134 may be formed on the conductive material 132a. The mask 134 may cover the conductive via 126. The mask 134 may include a positive-tone or negative-tone photoresist such as a polymer. The mask 134 may be patterned to have openings 136. In some embodiments, the openings 136 may be located on or within the cavity 110v2.

Figure 13:
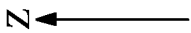
Figure 13:
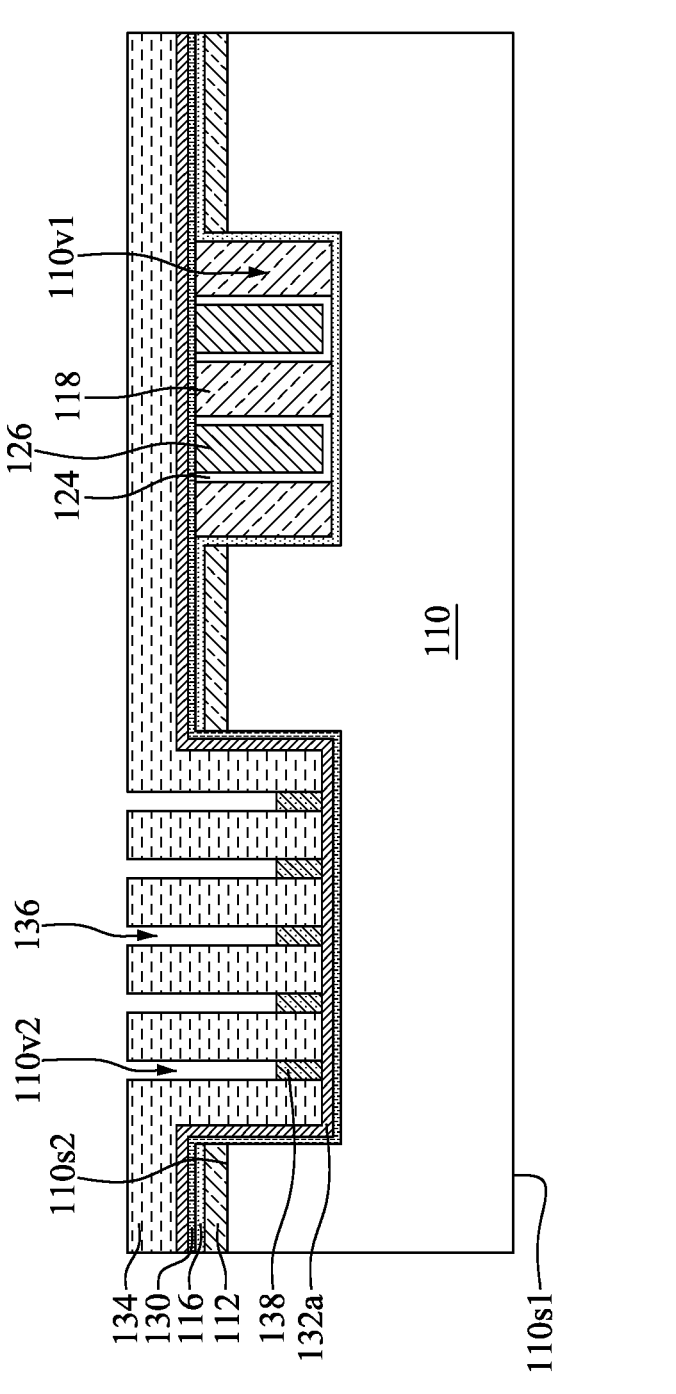

Referring to FIG. 13, conductive pillars 138 may be formed within the openings 136. In some embodiments, the conductive pillars 138 may be formed within the cavity 110v2. The conductive pillar 138 may be formed by CVD, ALD, PVD, electroplating, or other suitable techniques.

Figure 14:
Figure 14:
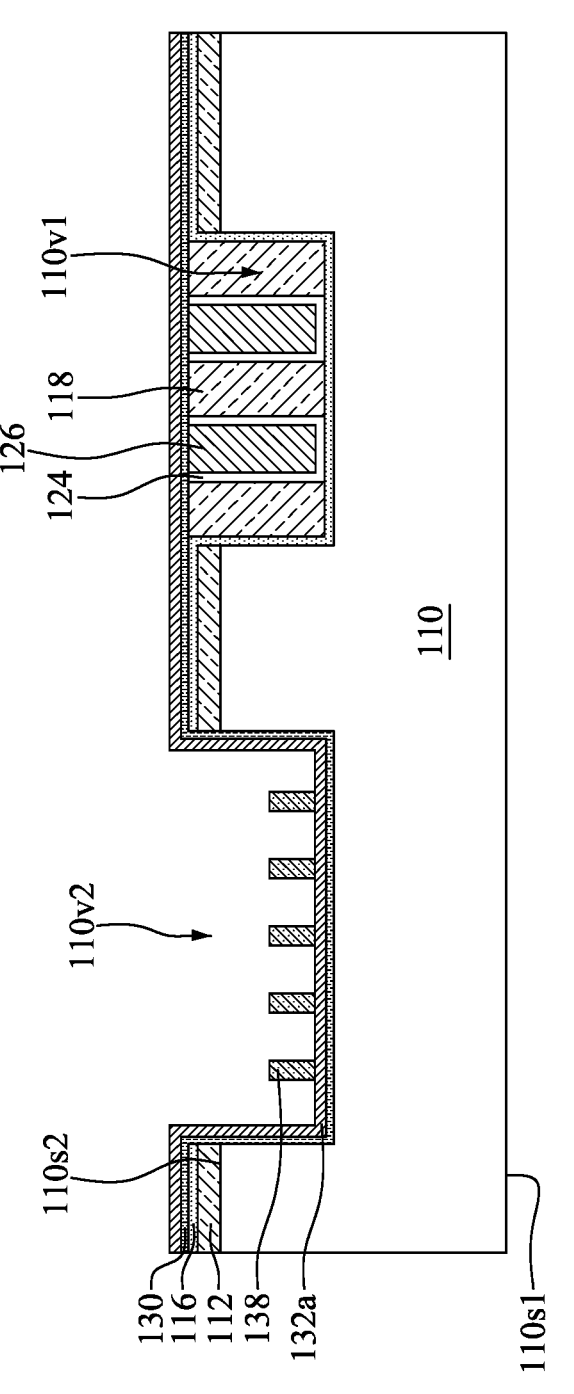

Referring to FIG. 14, the mask 134 may be removed. The conductive material 132a may be exposed.

Figure 15:
Figure 15:
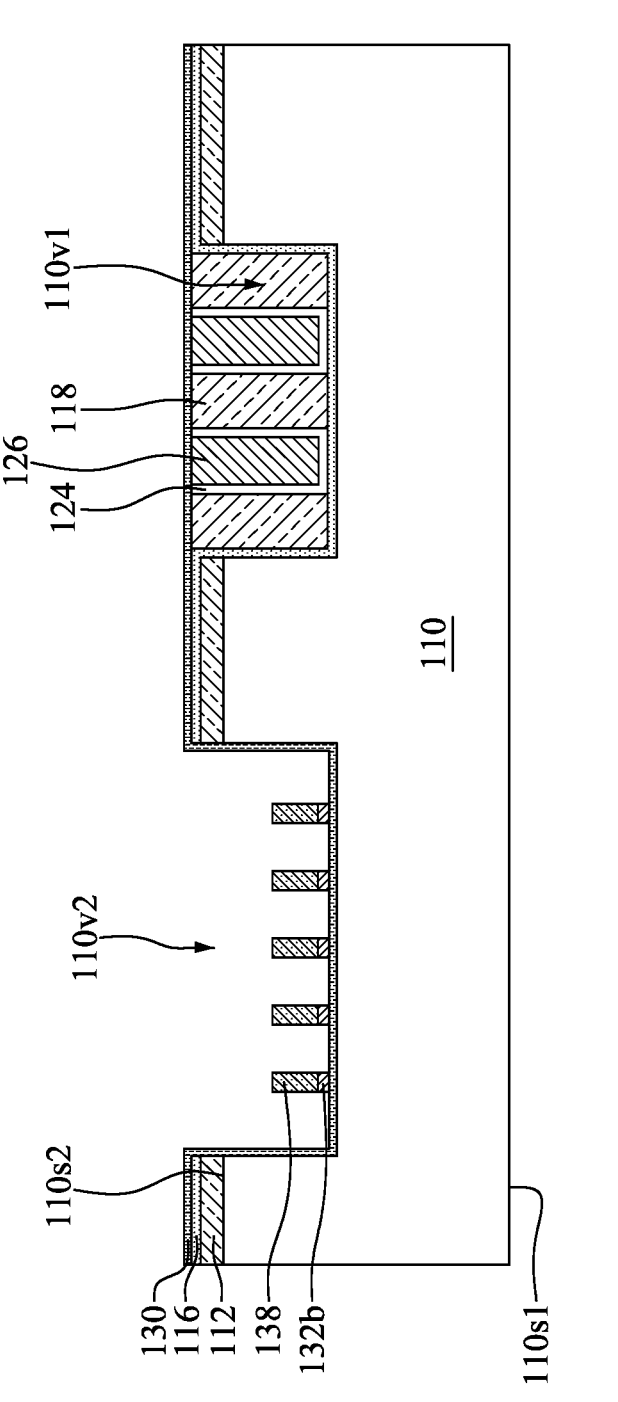

Referring to FIG. 15, the conductive material 132a exposed from the conductive pillar 138 may be removed, and the electrical connections 132b may be formed on the protection layer 130.

Figure 16:
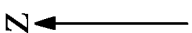
Figure 16:
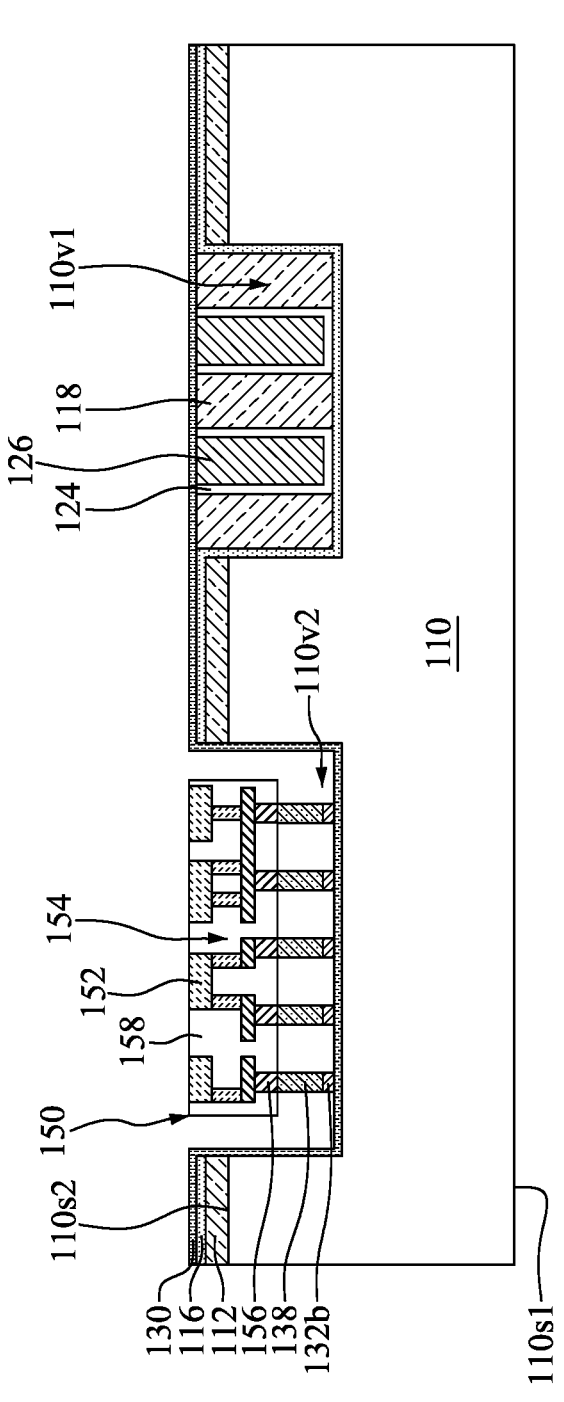

Referring to FIG. 16, a package structure 150 may be attached to the conductive pillar 138. In some embodiments, the package structure 150 may be disposed within the cavity 110v2 of the interposer 110. The package structure 150 may include a plurality of electronic components 152, a redistribution structure 154, a plurality of conductive pads 156, and an encapsulant 158 encapsulating the electronic component 152, the redistribution structure 154, and the conductive pads 156. In some embodiments, the conductive pads 156 may be bonded to the conductive pillars 138.

Figure 17:
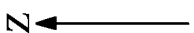
Figure 17:
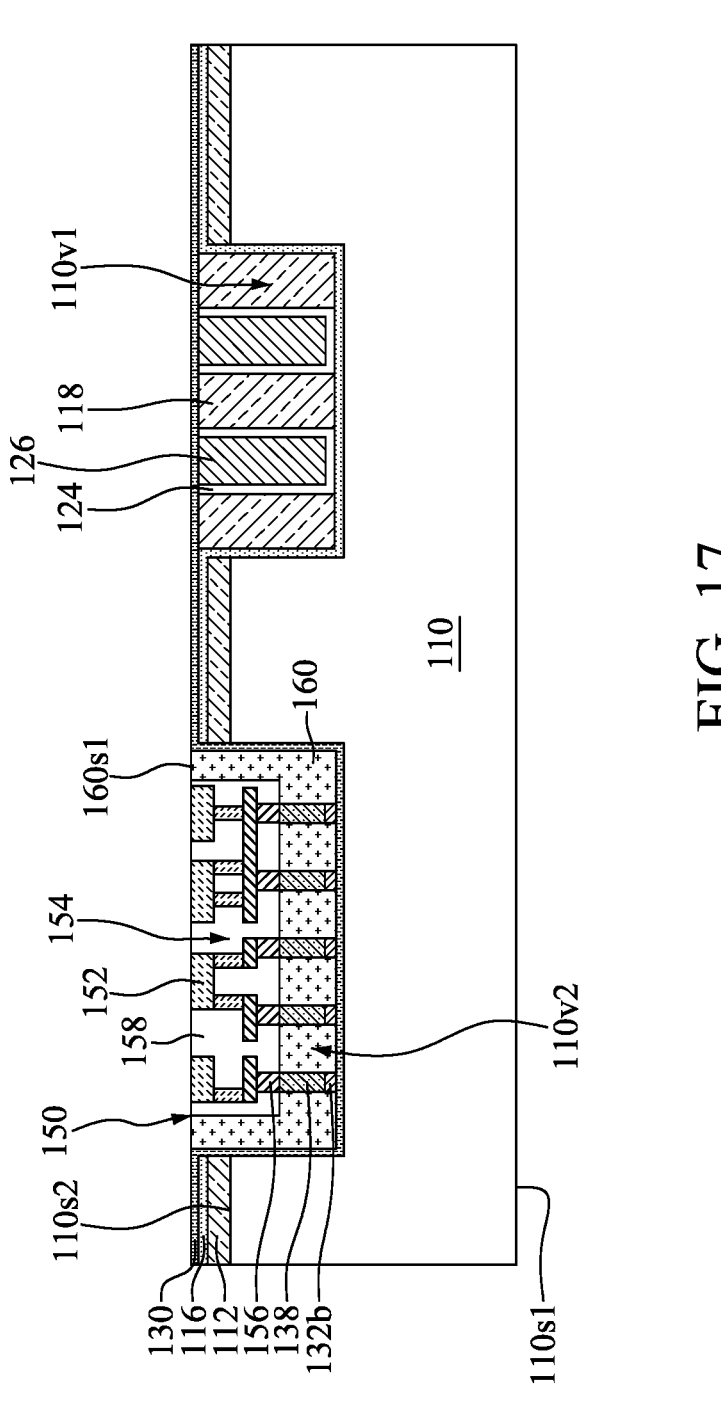

Referring to FIG. 17, an encapsulant 160 may be formed within the cavity 110v2 to encapsulate the package structure 150.

Figure 18:
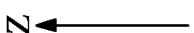
Figure 18:
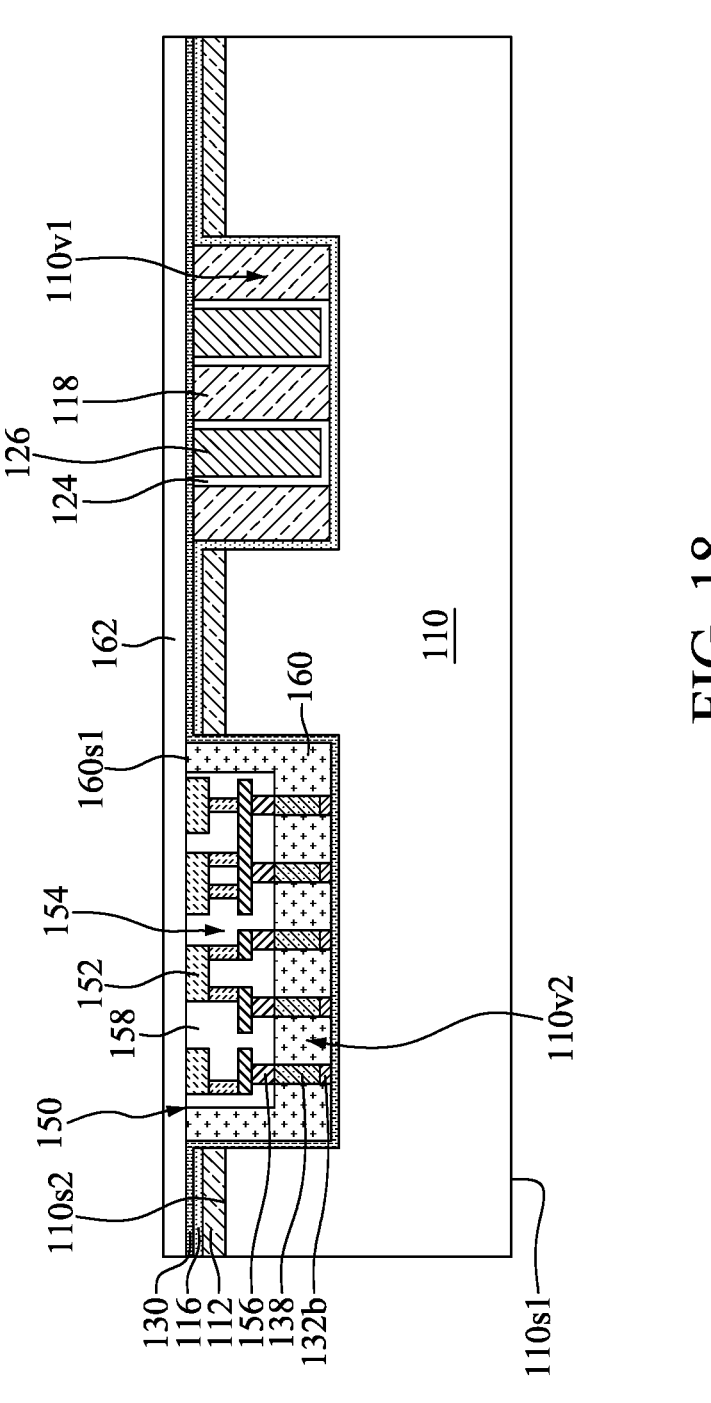

Referring to FIG. 18, a dielectric layer 162 may be formed on the package structure 150. The dielectric layer 162 may cover the protection layer 130. The dielectric layer 162 may be formed by CVD, ALD, PVD, or other suitable techniques.

Figure 19:
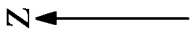
Figure 19:
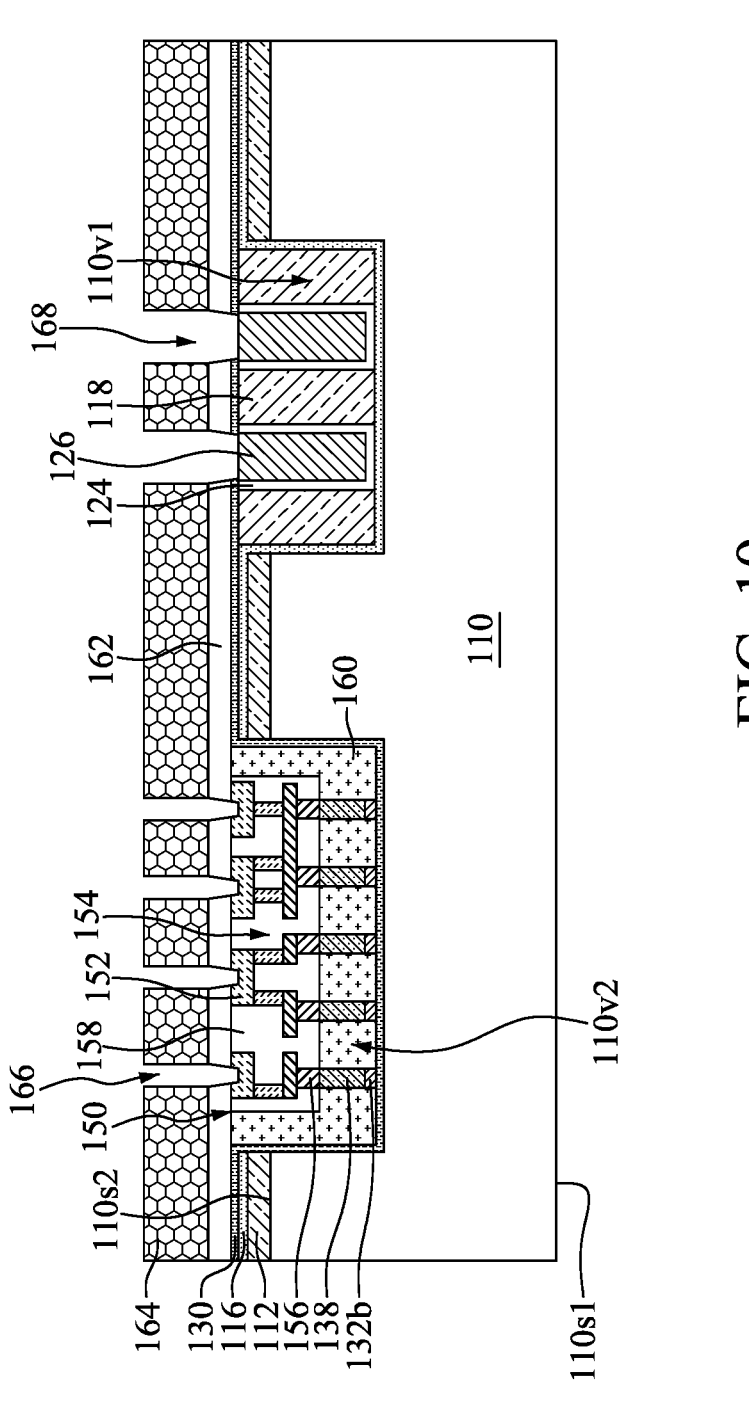

Referring to FIG. 19, a mask 164 may be formed on the dielectric layer 162. The mask 164 may include a positive-tone or negative-tone photoresist such as a polymer. The mask 164 may be patterned to have openings 166 and openings 168. In some embodiments, the opening 166 may penetrate the mask 164 and the dielectric layer 162. In some embodiments, the opening 166 may penetrate a portion of the electronic component 152. In some embodiments, the opening 166 may be located above the cavity 110v2. In some embodiments, the opening 168 may penetrate the mask 164 and the dielectric layer 162. In some embodiments, the opening 168 may penetrate the protection layer 130. In some embodiments, the opening 168 may be located above the cavity 110v1. The conductive via 126 may be exposed from the opening 168.

Figure 20:
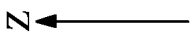
Figure 20:
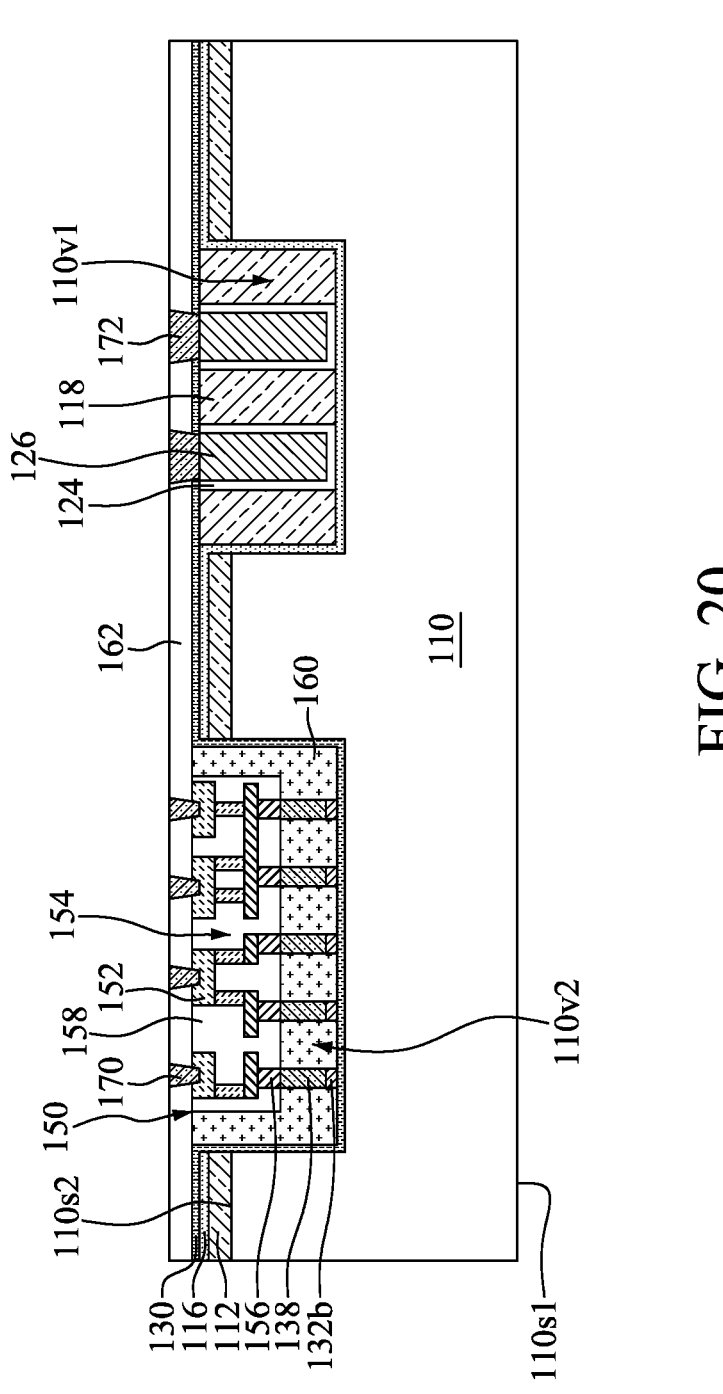

Referring to FIG. 20, the mask 164 may be removed, and conductive elements 170 and conductive elements 172 may be formed. The conductive element 170 may be formed within the opening 166 as shown in FIG. 19. The conductive element 172 may be formed within the opening 168 as shown in FIG. 19. In some embodiments, a conductive layer (not shown) may be formed, for example, by CVD, ALD, PVD, electroplating, or other suitable techniques, on the dielectric layer 162. The conductive layer may fill the opening 166 and the opening 168, and a CMP technique may be performed to remove the excessive portion of the conductive layer. As a result, the conductive elements 170 and the conductive element 172 may be formed.

Figure 21:
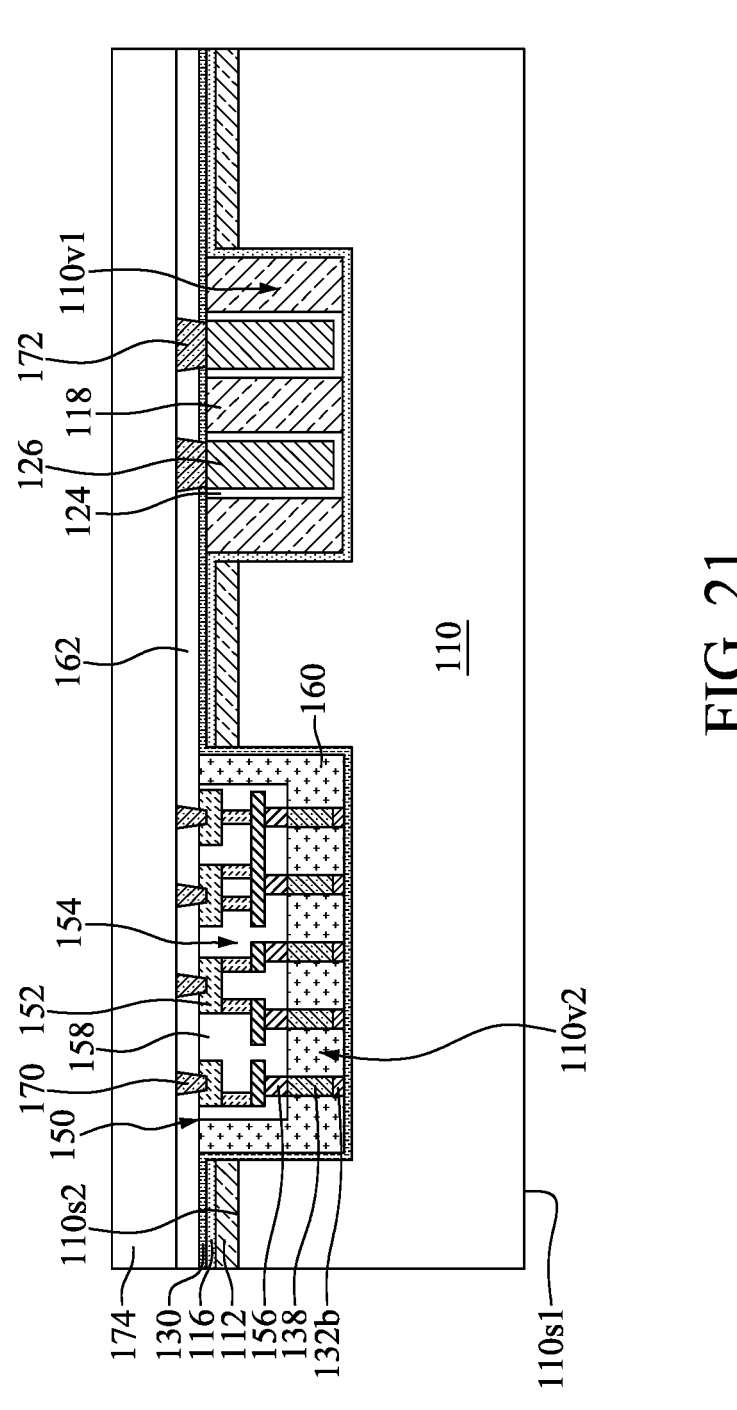

Referring to FIG. 21, the interposer 110 may be attached to a carrier 174. The carrier 174 may be in contact with the dielectric layer 162. The carrier 174 may include a glass substrate, a ceramic substrate, a plastic substrate, or other suitable carriers.

Figure 22:
Figure 22:
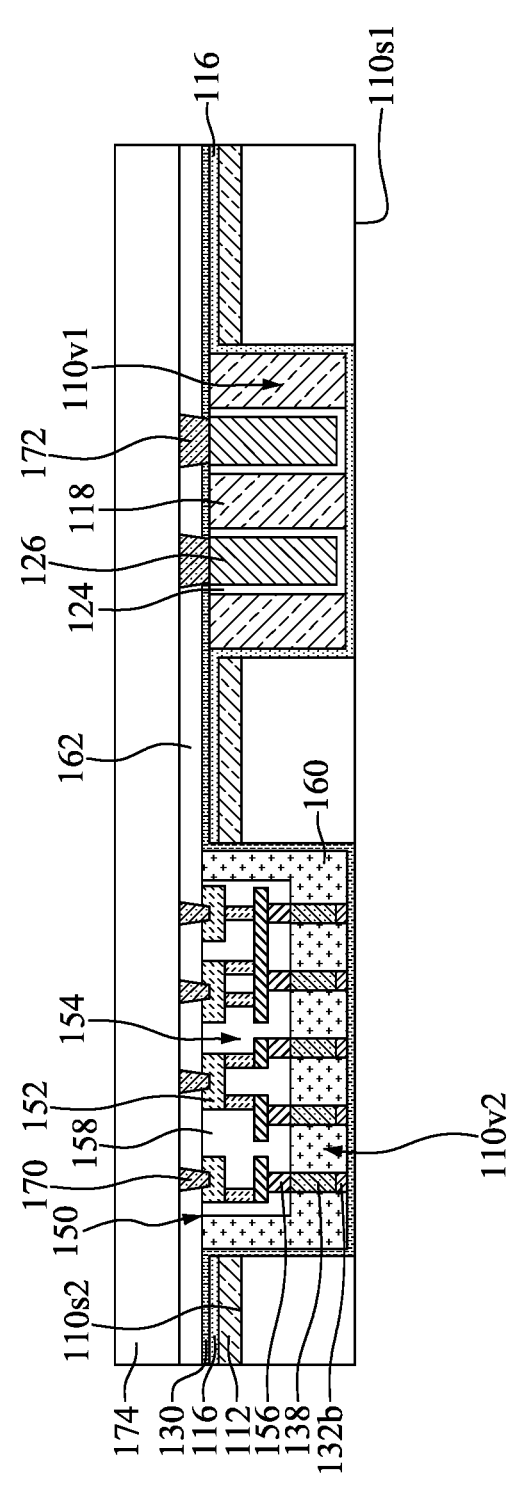

Referring to FIG. 22, a grinding technique, such as CMP technique may be performed on the surface 110s1 of the interposer 110. In some embodiments, the protection layer 116 may serve as a polishing stop layer (e.g., CMP stop layer). In some embodiments, the protection layer 130 may serve as a polishing stop layer (e.g., CMP stop layer). The protection layers 116 and protection layer 130 may be exposed from the interposer 110.

Figure 23:
Figure 23:
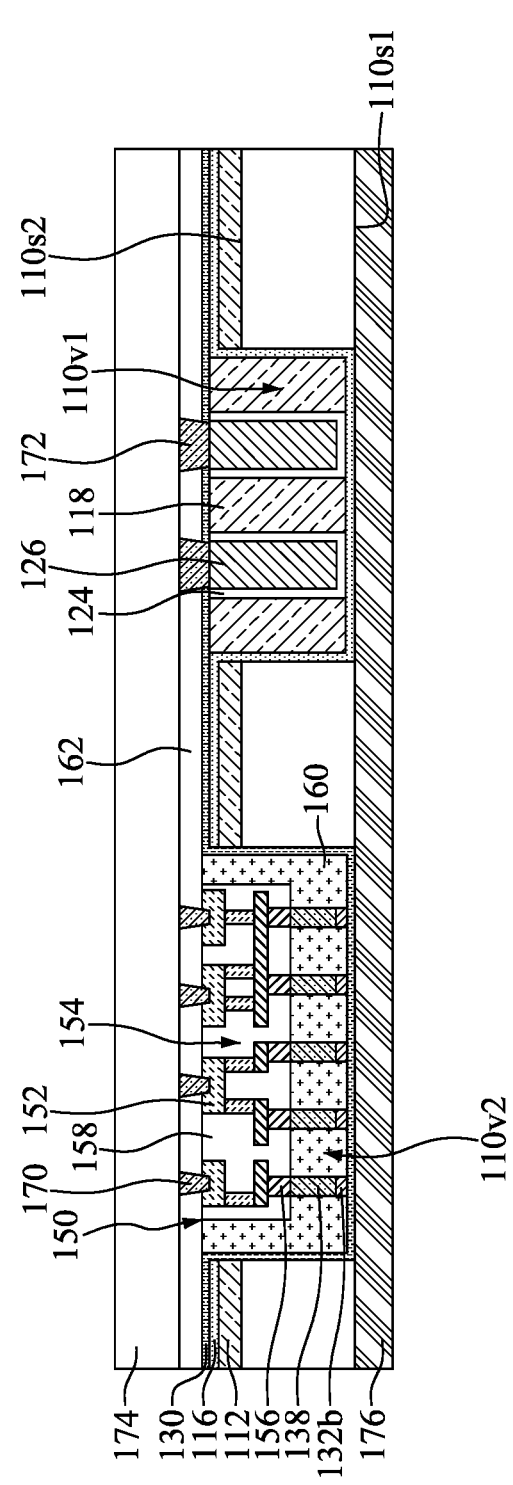

Referring to FIG. 23, a sacrificial layer 176 may be formed on the surface 110s1 of the interposer 110. The sacrificial layer 176 may include silicon oxide, silicon nitride, silicon oxynitride, or a combination thereof. The sacrificial layer 176 may be formed by CVD, ALD, PVD, electroplating, or other suitable techniques.

Figure 24:
Figure 24:
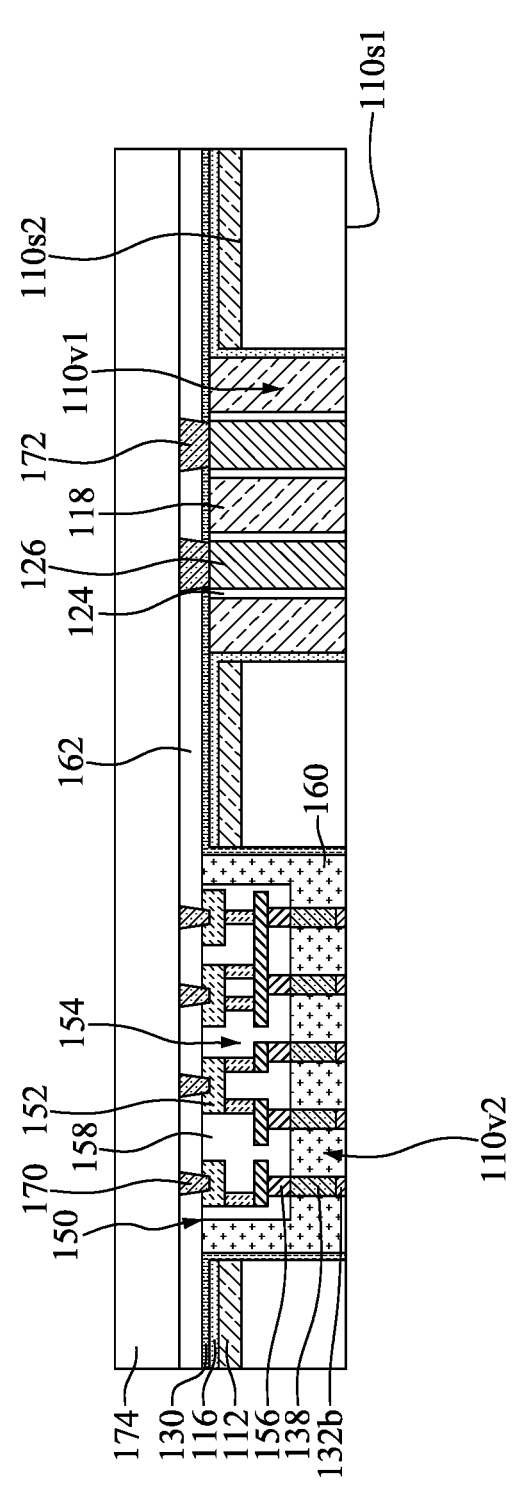

Referring to FIG. 24, a polishing technique, such as a CMP technique may be performed to remove the sacrificial layer 176. In some embodiments, the bottom of the protection layer 116 may be removed. In some embodiments, the bottom of the protection layer 130 may be removed. In some embodiments, a portion of the seed layer 124 may be removed, and the bottom of the conductive via 126 may be exposed. The surface 110s1 of the interposer 110 may be exposed.

Figure 25:
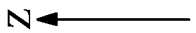
Figure 25:
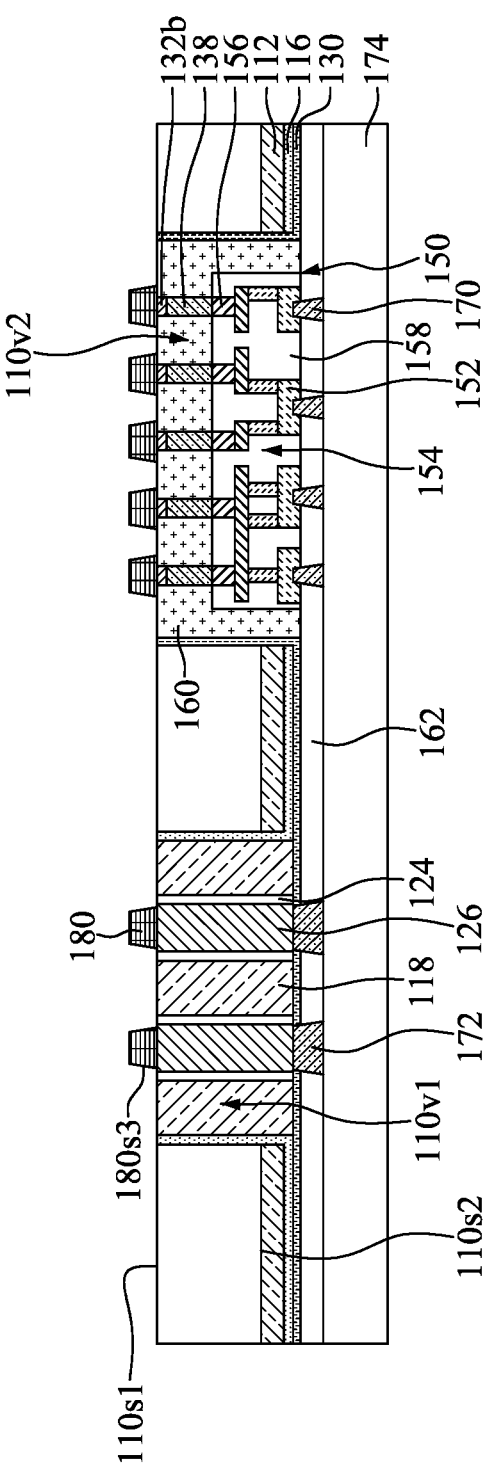

Referring to FIG. 25, conductive elements 180 may be formed on the surface 110s1 of the interposer 110. The conductive element 180 may be electrically connected to the electrical connection 132b and the conductive via 126, respectively and correspondingly. In some embodiments, the conductive element 180 may be tapered away from the interposer 110. That is, the sidewalls 180s3 of the conductive elements 180 may be slanted. In some embodiments, the sidewalls 180s3 of the conductive element 180 may be substantially vertical.

Figure 26:
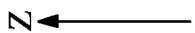
Figure 26:
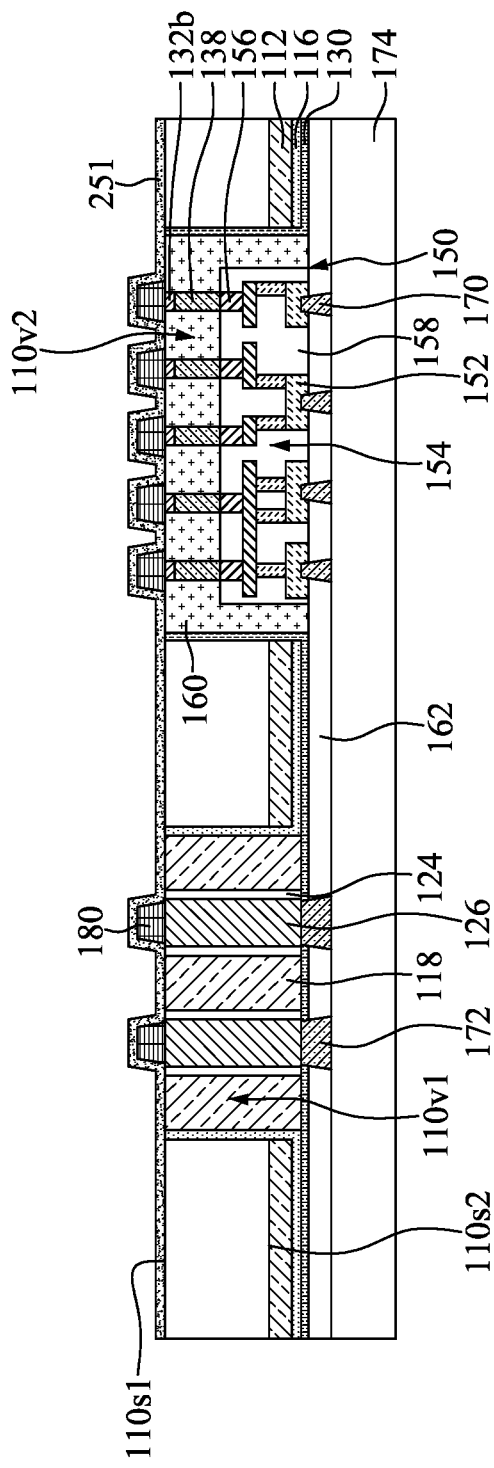

Referring to FIG. 26, a layer of spacer material 251 may be conformally formed on the surface 110s1 of the interposer 110 and may cover the conductive element 180. In some embodiments, the spacer material 251 may be formed of, for example, a low-k oxide-based dielectric, such as carbon-doped silicon oxide or fluorinated oxide. In some embodiments, the layer of spacer material 251 may be formed by, for example, CVD, ALD, or other suitable techniques.

Figure 27:
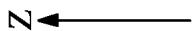
Figure 27:
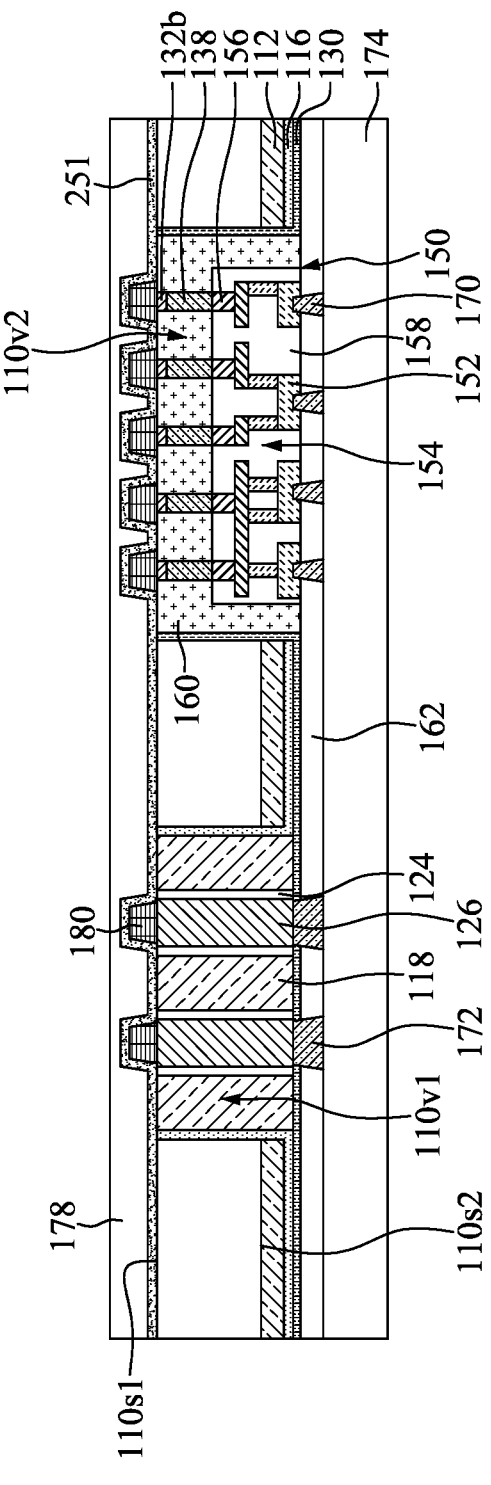

Referring to FIG. 27, a passivation layer 178 may be formed on the surface 110s1 of the interposer 110. Detailedly, the passivation layer 178 may be formed on the layer of spacer material 251. State differently, the conductive element 180 and the layer of spacer material 251 may be formed within the passivation layer 178. The passivation layer 178 may be formed by coating or other suitable techniques.

Figure 28:
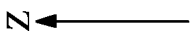
Figure 28:
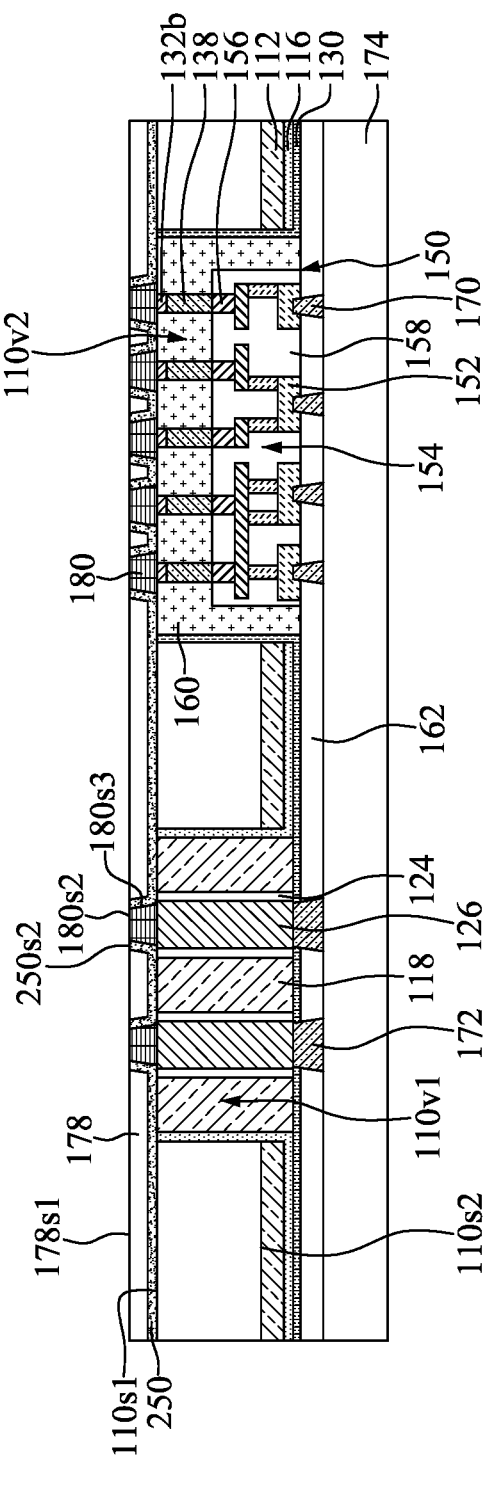

Referring to FIG. 28, a polishing technique, such as a CMP technique may be performed to remove a portion of the layer of spacer material 251. The surfaces 180s2 of the conductive element 180 may be exposed. The remaining spacer material 251 may be referred to as the spacers 250. In some embodiments, the surface 180s2 of the conductive element 180, the surface 110s1 of the interposer 110, and the surface 250s2 of the spacer 250 may be substantially coplanar.

Figure 29:
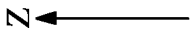
Figure 29:
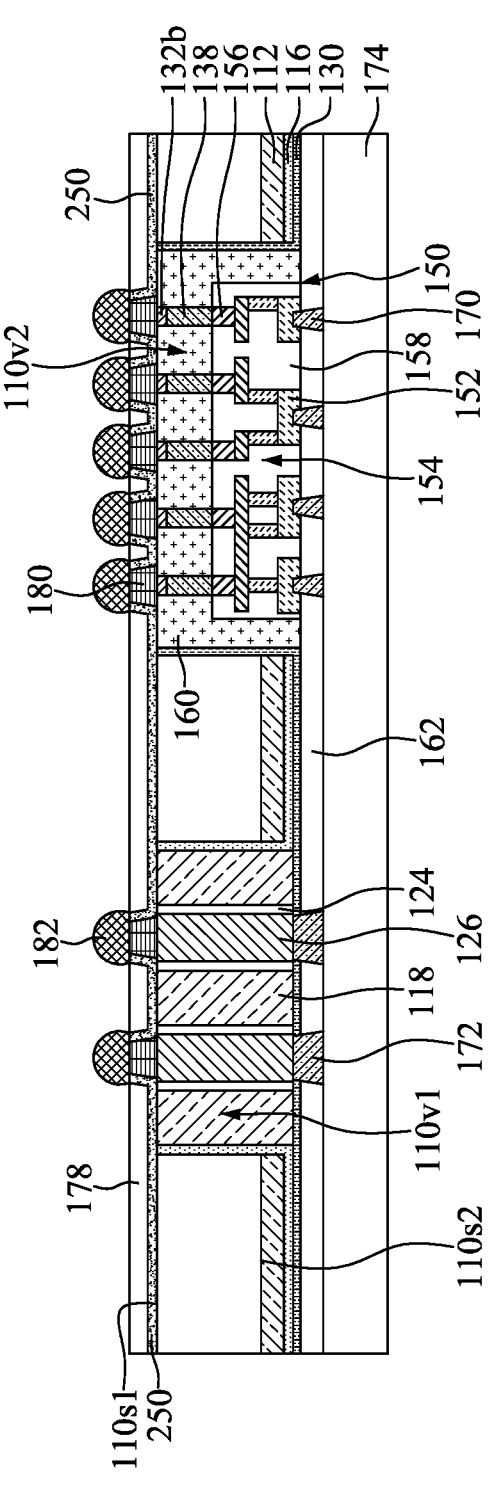

Referring to FIG. 29, in some embodiments, electrical connections 182 may be formed on the conductive elements 180, respectively and correspondingly.

Figure 30:
Figure 30:
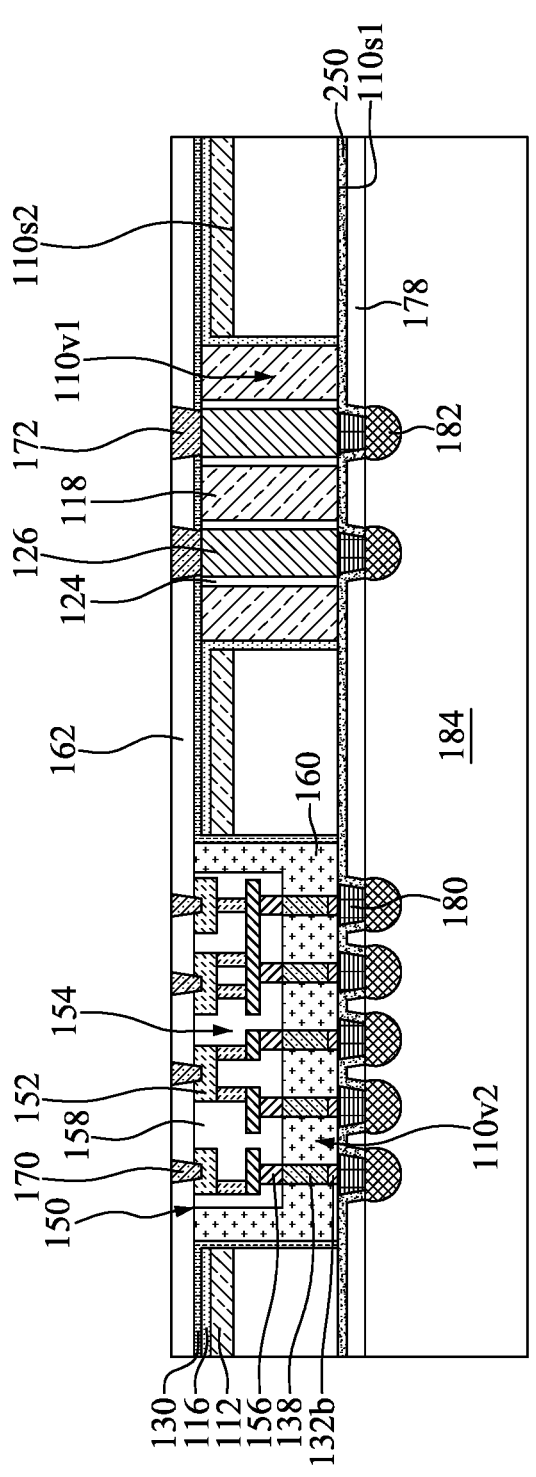

Referring to FIG. 30, the surface 110s1 of the interposer 110 may be attached to a holder 184. The holder 184 may include a tape, or other suitable materials.

Figure 31:
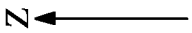
Figure 31:
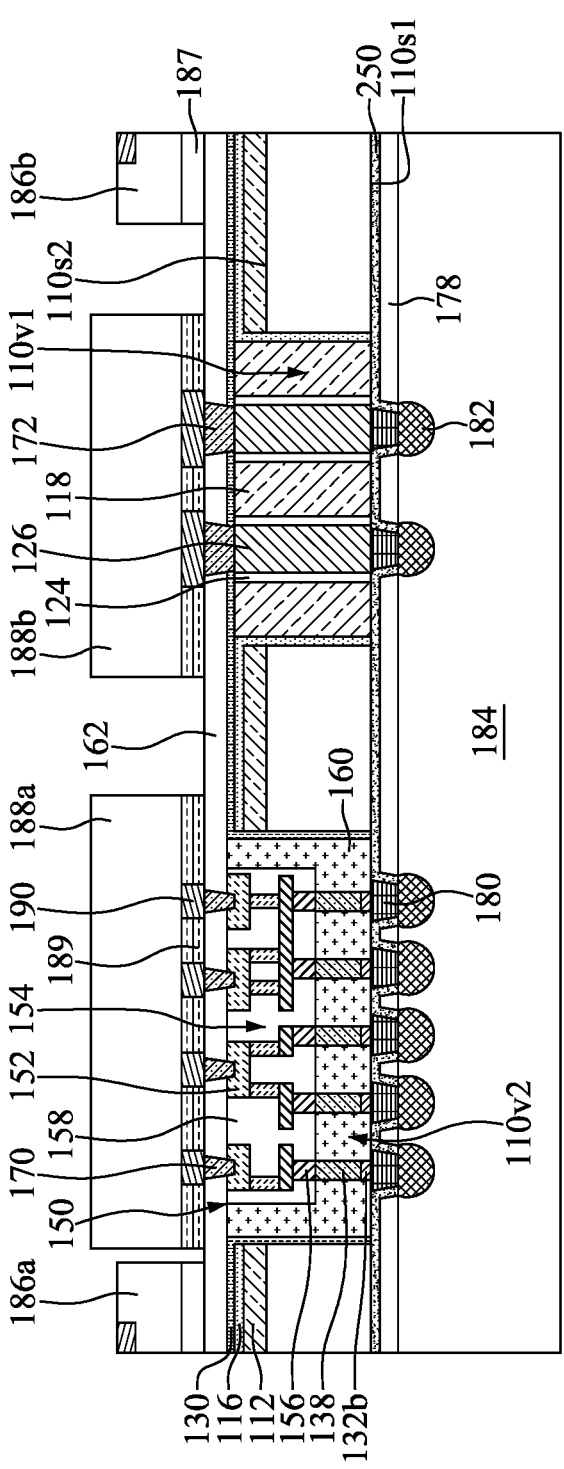

Referring to FIG. 31, electronic components 186a, 186b, 188a, and 188b may be attached to the surface 110s2 of the interposer 110. The electronic component 186a and the electronic component 186b may be attached to the dielectric layer 162 by an adhesive layer 187. The passivation layer 189 and the conductive elements 190 may be formed on the active surface of the electronic component 188a and the electronic component 188b. In some embodiments, a hybrid bonding technique may be performed to bond the electronic component 188a (or the electronic component 188b) and the dielectric layer 162 and the conductive elements 170 (or the conductive elements 172). Detailedly, the hybrid bonding technique may include an oxide-to-oxide bonding and a metal-to-metal bonding. The oxide-to-oxide bonding may originate from the bonding between the passivation layer 189 of the electronic component 188a (or the electronic component 188b) and the dielectric layer 162. The metal-to-metal bonding may originate from the bonding between the conductive elements 190 of the electronic component 188a (or the electronic component 188b) and the conductive elements 170 (or the conductive elements 172). In some embodiments, a temperature of hybrid bonding technique may be between about 300° C. and about 450° C.

In some embodiments, the electronic component 188a may be disposed above the package structure 150. The electronic component 188b may be disposed above the conductive via 126.

Referring to FIG. 32, the holder 184 may be removed. The interposer 110 may be sawed so that a plurality of structures as shown in FIG. 31 may be separated. A mother board 194 may be attached to the surface 110s1 of the interposer 110. In some embodiments, the electrical connections 182 may be bonded to the pads (not annotated) of the mother board 194. In some embodiments, the electrical connections 196 may be bonded to the pads (not annotated) of the mother board 194.

Referring to FIG. 33, conductive wires 198 may be formed to electrically connect the mother board 194 and the electronic component 186a (or 186b). As a result, the semiconductor device 10 may be produced.

One aspect of the present disclosure provides a semiconductor device including an interposer having a first surface and a second surface parallel to the first surface; a conductive via extending between the first surface and the second surface of the interposer; an insulation layer separating the conductive via from the interposer; a first electronic component positioned on the second surface and electrically connected to the conductive via; a first conductive element positioned on the first surface of the interposer and electrically connected to the conductive via; a spacer conformally positioned on the first surface of the interposer and on sidewalls of the first conductive element; and a passivation layer positioned on the spacer. The passivation layer has a first dielectric constant, and the spacer has a second dielectric constant less than the first dielectric constant.

Another aspect of the present disclosure provides a semiconductor device including an interposer having a first surface and a second surface parallel to the first surface, wherein the interposer defines a first cavity and a second cavity extending between the first surface and the second surface; a through-insulation via positioned within the first cavity; a first electronic component positioned on the second surface of the interposer and electrically connected to the through-insulation via; a second electronic component positioned within the second cavity; a first conductive element positioned on the first surface of the interposer and electrically connected to the through-insulation via; a spacer conformally positioned on the first surface of the interposer and on sidewalls of the first conductive element; and a passivation layer positioned on the spacer. The passivation layer has a first dielectric constant, and the spacer has a second dielectric constant less than the first dielectric constant.

Another aspect of the present disclosure provides a method for fabricating a semiconductor device including providing an interposer including a first surface and a second surface parallel to the first surface; recessing a first cavity from the second surface; forming an insulation layer filling the first cavity; forming a conductive via penetrating the insulation layer; thinning the interposer from the first surface to expose the conductive via; forming a first conductive element on the first surface of the interposer and electrically connected to the conductive via; conformally forming a spacer on the first surface of the interposer and sidewalls of the first conductive element; forming a passivation layer on the spacer; and performing a hybrid bonding technique to bond a first electronic component on the second surface of the interposer and electrically connected to the conductive via. The passivation layer has a first dielectric constant, and the spacer has a second dielectric constant less than the first dielectric constant.

Due to the design of the semiconductor device of the present disclosure, the TIV (e.g., the conductive via 126) has a relatively small parasitic capacitance in comparison with a TSV. Further the depth of the TIV may be controlled by determining the depth of the cavity (e.g., 110v1), and the protection layer (e.g., 116) may prevent the interposer 110 from being over polished. As a result, the depth of the TIV may be relatively well controlled in comparison with the TSV. In addition, the RC delay may be reduced by employing the passivation layer 178 and spacers 250 having different dielectric constants. As a result, the performance of the semiconductor device 10 may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
an interposer having a first surface and a second surface parallel to the first surface;
a conductive via extending between the first surface and the second surface of the interposer;
an insulation layer separating the conductive via from the interposer;

a first electronic component positioned on the second surface and electrically connected to the conductive via;
a first conductive element positioned on the first surface of the interposer and electrically connected to the conductive via;
a spacer conformally positioned on the first surface of the interposer and on sidewalls of the first conductive element; and
a passivation layer positioned on the spacer;
wherein the passivation layer has a first dielectric constant, and the spacer has a second dielectric constant less than the first dielectric constant.

2. The semiconductor device of claim 1, further comprising a second electronic component embedded within the interposer.

3. The semiconductor device of claim 2, wherein the second electronic component is embedded in a package structure.

4. The semiconductor device of claim 2, further comprising a conductive pillar extending between the first surface of the interposer and the second electronic component.

5. The semiconductor device of claim 2, further comprising an encapsulant encapsulating the second electronic component, wherein the encapsulant fully penetrates the interposer.

6. The semiconductor device of claim 2, further comprising a third electronic component positioned on the second electronic component and electrically connected to the second electronic component.

7. The semiconductor device of claim 6, further comprising a second conductive element electrically connecting the second electronic component and the third electronic component, wherein the second conductive element penetrates the second electronic component.

8. The semiconductor device of claim 6, wherein the insulation layer comprises silicon oxide.

9. The semiconductor device of claim 6, further comprising:
a fourth electronic component positioned on the second surface of the interposer;
a mother board supporting the interposer; and
a conductive wire electrically connecting the fourth electronic component and the mother board.

10. The semiconductor device of claim 1, further comprising a protection layer positioned on the second surface of the interposer, wherein the protection layer is further positioned between the conductive via and the interposer, wherein the protection layer has a third surface substantially coplanar with the first surface of the interposer.

11. The semiconductor device of claim 1, wherein the spacer comprises low-k oxide-based dielectrics.

12. The semiconductor device of claim 1, wherein the passivation layer comprises silicon oxide.

* * * * *